United States Patent
Oshio et al.

(10) Patent No.: US 9,732,271 B2
(45) Date of Patent: Aug. 15, 2017

(54) RARE EARTH ALUMINUM GARNET-TYPE INORGANIC OXIDE, PHOSPHOR AND LIGHT-EMITTING DEVICE USING SAME

(71) Applicant: Panasonic Intellectual Property Management Co., Ltd., Osaka (JP)

(72) Inventors: Shozo Oshio, Osaka (JP); Natsuki Sato, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 175 days.

(21) Appl. No.: 14/652,313

(22) PCT Filed: Oct. 31, 2013

(86) PCT No.: PCT/JP2013/006461
§ 371 (c)(1),
(2) Date: Jun. 15, 2015

(87) PCT Pub. No.: WO2014/097527
PCT Pub. Date: Jun. 26, 2014

(65) Prior Publication Data
US 2015/0344775 A1    Dec. 3, 2015

(30) Foreign Application Priority Data

Dec. 20, 2012 (JP) .................. 2012-278132
Apr. 26, 2013 (JP) .................. 2013-094497

(51) Int. Cl.
| | |
|---|---|
| C01G 25/00 | (2006.01) |
| C01G 27/00 | (2006.01) |
| H01L 33/50 | (2010.01) |
| C09K 11/08 | (2006.01) |
| C09K 11/80 | (2006.01) |
| C09K 11/83 | (2006.01) |
| C09K 11/77 | (2006.01) |
| C01F 17/00 | (2006.01) |
| C01F 7/00 | (2006.01) |

(52) U.S. Cl.
CPC .......... C09K 11/7792 (2013.01); C01F 7/002 (2013.01); C01F 17/0025 (2013.01); C01G 25/006 (2013.01); C01G 27/006 (2013.01); C09K 11/7721 (2013.01); C09K 11/7734 (2013.01); C09K 11/7749 (2013.01); C09K 11/7774 (2013.01); H01L 33/502 (2013.01); *C01P 2002/50* (2013.01); *C01P 2002/52* (2013.01); *C01P 2002/72* (2013.01); *C01P 2002/84* (2013.01); *H01L 33/504* (2013.01); *H01L 2224/45144* (2013.01); *H01L 2224/48091* (2013.01)

(58) Field of Classification Search
CPC ............ C09K 11/7792; C09K 11/7721; C09K 11/7734; C09K 11/7749; C09K 11/7774; C01F 7/002; C01F 17/0025; C01G 25/006; C01G 27/006; H01L 33/502
See application file for complete search history.

(56) References Cited

U.S. PATENT DOCUMENTS

| | | | |
|---|---|---|---|
| 6,812,500 B2 | 11/2004 | Reech et al. | |
| 8,957,575 B2* | 2/2015 | Oshio ................ | C09K 11/7774 252/301.4 F |
| 2006/0138288 A1* | 6/2006 | Parsons ................. | A61G 15/10 248/125.7 |
| 2006/0138388 A1 | 6/2006 | Kummer et al. | |
| 2010/0213817 A1 | 8/2010 | Shimomura et al. | |
| 2011/0279022 A1 | 11/2011 | Winkler et al. | |
| 2012/0175557 A1 | 7/2012 | Tao et al. | |
| 2014/0084323 A1 | 3/2014 | Shimizu et al. | |
| 2014/0152173 A1 | 6/2014 | Oshio et al. | |

FOREIGN PATENT DOCUMENTS

| | | |
|---|---|---|
| CN | 101031630 A | 9/2007 |
| CN | 101495424 A | 7/2009 |
| JP | 05-40720 B2 | 6/1993 |
| JP | 2001-192655 A | 7/2001 |
| JP | 2003-505582 A | 2/2003 |
| JP | 3503139 B2 | 12/2003 |
| JP | 2009-544791 A | 12/2009 |
| JP | 2011-213552 * | 10/2011 |
| WO | WO 2008/012712 A1 | 1/2008 |
| WO | WO 2009/041297 A1 | 4/2009 |
| WO | WO 2010/043287 A1 | 4/2010 |
| WO | WO 2012/009455 * | 1/2012 |
| WO | WO 2012/009455 A1 | 1/2012 |

(Continued)

OTHER PUBLICATIONS

Translation for JP 2011-213552, Oct. 2011.*
International Search Report for corresponding International Application No. PCT/JP2013/006461 mailed Feb. 10, 2014.

(Continued)

*Primary Examiner* — Carol M Koslow
(74) *Attorney, Agent, or Firm* — Renner, Otto, Boisselle & Sklar, LLP

(57) ABSTRACT

An inorganic oxide of the present invention has a composition represented by General formula (1): $M_2LnX_2(AlO_4)_3$ (where M includes Ca, Ln includes Tb, and X includes at least either one of Zr and Hf). Then, a number of Tb atoms in General formula (1) is 0.1 or more to 1 or less. Moreover, a crystal structure of the inorganic oxide is a garnet structure. A phosphor made of this inorganic oxide is capable of being excited by short-wavelength visible light, and can radiate narrow-band green light.

16 Claims, 8 Drawing Sheets

(56) References Cited

FOREIGN PATENT DOCUMENTS

WO  WO 2013/005356 A1    1/2013
WO  WO 2013/005356    * 10/2013

OTHER PUBLICATIONS

"Phosphor Handbook", edited by the Phosphor Research Society, 1999, pp. 12, 237-238, 268-278, 332).
Chinese Search Report for corresponding Chinese Application No. 201380067342.9 issued Feb. 6, 2016.

* cited by examiner

RARE EARTH ALUMINUM GARNET-TYPE INORGANIC OXIDE, PHOSPHOR AND LIGHT-EMITTING DEVICE USING SAME

TECHNICAL FIELD

The present invention relates to a rare earth aluminum garnet-type inorganic oxide, a phosphor, and a light-emitting device using the same.

BACKGROUND ART

Heretofore, many compounds, each of which has a crystal structure of garnet (hereinafter, also referred to as a garnet structure), have been known. Natural garnet is a silicate mineral, and those with high transparency have been valued as jewelry since ancient times, and sand of the garnet is industrially used as abrasive.

Famous garnet includes almandine ($Fe^{2+}_3Al_2(SiO_4)_3$), grossular ($Ca_3Al_2(SiO_4)_3$), and andradite ($Ca_3Fe^{3+}_2(SiO_4)_3$). Moreover, the famous garnet includes pyrope ($Mg_3Al_2(SiO_4)_3$), spessartine ($Mn_3Al_2(SiO_4)_3$), uvarovite ($Ca_3Cr_2(SiO_4)_3$), and the like.

Here, a compound represented by $Y_3Al_2(AlO_4)_3$, (which is hereinafter also referred to as YAG), is an artificial mineral synthesized based on the garnet, and is widely known as a name of yttrium aluminum garnet. Then, YAG is used for the purpose of a solid-state laser, translucent ceramics, a phosphor and the like (for example, refer to Non-Patent Literature 1). Moreover, it is known that the YAG includes many modification examples. Typical modification examples of YAG include $Tb_3Al_2(AlO_4)_3$ (for example, refer to Patent Literature 1), $Y_3Ga_2(AlO_4)_3$ (for example, refer to Non-Patent Literature 1), $Y_3Mg_2(AlO_4)(SiO_4)_2$ (for example, refer to Patent Literature 2) and the like.

Here, the phosphor stands for a compound that emits fluorescence by being given a stimulus such as ultraviolet excitation. Then, extranuclear electrons of a specific atom that composes the compound are excited by the ultraviolet ray and the like, and a difference in energy level is emitted as visible light when the extranuclear electrons return to a ground state thereof. For example, rare earth ions and transition metal ions ($Ce^{3+}$, $Tb^{3+}$, $Eu^{3+}$, $Mn^{2+}$, $Mn^{4+}$, $Fe^{3+}$, $Cr^{3+}$ and the like), each of which functions as a emission center, are contained in such a compound as YAG, whereby the phosphor is obtained.

Then, a phosphor having a garnet structure, such as a YAG:Ce phosphor activated by $Ce^{3+}$ and a YAG:Tb phosphor activated by $Tb^{3+}$, (which is hereinafter also referred to as a garnet-type phosphor), is known as a high-efficiency phosphor. Then, the garnet-type phosphor as described above is used in numerous light-emitting devices (for example, refer to Patent Literatures 3 and 4 and Non-Patent Literature 1).

Note that the garnet-type phosphor activated by $Ce^{3+}$ is characterized in, at a time of being irradiated with a corpuscular ray or an electromagnetic wave, being excited and emitting ultrashort afterglow visible light from blue green through green and yellow to red (for example, refer to Non-Patent Literature 1 and Patent Literature 2). Meanwhile, a YAG:Eu phosphor activated by $Eu^{3+}$ is also known, and study thereof as a red phosphor for a plasma display device (PDP) is made (for example, refer to Non-Patent Literature 1).

CITATION LIST

Patent Literature

Patent Literature 1: Japanese Unexamined Patent Application Publication No. 2003-505582
Patent Literature 2: International Publication No. 2010/043287
Patent Literature 3: Japanese Patent No. 3503139
Patent Literature 4: U.S. Pat. No. 6,812,500

Non Patent Literature

Non Patent Literature 1: edited by Keikoutaidougakukai, "Phosphor Handbook", Ohmsha, Ltd., December 1987, pp. 12, 237 to 238, 268 to 278, 332

SUMMARY OF INVENTION

Technical Problem

The conventional $Ce^{3+}$-activated phosphor that has the garnet structure is excited by short-wavelength visible light (wavelength of 380 nm or more to less than 470 nm), and is capable of color tone control for the light emission. However, the conventional $Ce^{3+}$-activated phosphor has a wide half-width of an emission spectrum, and accordingly, there has been a problem that a luminous flux and color rendering properties of an illumination light source that applies the $Ce^{3+}$-activated phosphor are decreased.

Moreover, the conventional $Tb^{3+}$-activated phosphor and $Eu^{3+}$-activated phosphor, which have the garnet structure, are hardly excited by the short-wavelength visible light. Therefore, it has been difficult to provide a light-emitting device, which uses, as an excitation source, a solid-state light-emitting element emitting the short-wavelength visible light, and emits green light and red light.

The present invention has been made in consideration of such a problem as described above, which is inherent in the prior art. Then, it is an object of the present invention to provide a rare earth aluminum garnet-type inorganic oxide and a phosphor, which are capable of being excited by the short-wavelength visible light, and further, are capable of emitting the narrow-band green light and/or red light, and to provide a light-emitting device using the same.

Solution to Problem

An inorganic oxide according to a first aspect of the present invention has a composition represented by General formula:

$$M_2LnX_2(AlO_4)_3 \quad (1)$$

(where M includes Ca, Ln includes Tb, and X includes at least either one of Zr and Hf). Then, a number of Tb moles in General formula (1) is 0.1 or more to 1 or less, and a crystal structure of the inorganic oxide is a garnet structure.

An inorganic oxide according to a second aspect of the present invention is the inorganic oxide according to the first aspect, wherein M includes: Ca; and at least one element selected from the group consisting of alkaline earth metal, Fe, Mn, Zn Cd, Co and Cu. Then, Ln includes: Tb; and at least one element selected from the group consisting of Sc, Y, La, Ce, Pr, Nd, Sm, Eu, Gd, Dy, Ho, Er, Tm, Yb, Lu, In, Sb and Bi. Moreover, X includes: at least either one of Zr and Hf; and at least one element selected from the group consisting of Si, Ge, Ti, Sn and Pb.

An inorganic oxide according to a third aspect of the present invention is the inorganic oxide according to the first aspect, wherein M is Ca, and Ln is Tb.

An inorganic oxide according to a fourth aspect of the present invention is the inorganic oxide according to the first aspect, wherein M is Ca, Ln is Tb, and X is either one of Zr and Hf.

A solid solution according to a fifth aspect of the present invention is a solid solution including the inorganic oxide according to any one of the first to fourth aspects and an inorganic compound that is solid-solved with the above-described inorganic oxide and is different from the inorganic oxide in composition. Then, a number of Tb moles in 1 mol of the solid solution is 0.1 mol or more to less than 3 mol, and a crystal structure of the solid solution is the garnet structure.

A solid solution according to a sixth aspect of the present invention is the solid solution according to the fifth aspect, wherein the inorganic compound has a composition represented by General formula (2): $Ca_2EuX_2(AlO_4)_3$.

A solid solution according to a seventh aspect of the present invention is the solid solution according to the fifth aspect thereof, wherein the inorganic compound has a composition represented by General formula (3): $M_3Zr_2(AlO_4)_2(SiO_4)$.

A solid solution according to an eighth aspect of the present invention is the solid solution according to the fifth aspect, wherein the solid solution has a composition represented by General formula (4): $A_3D_2(EG_4)_3$. Note that, in the formula, A includes: Ca and Tb; and at least one element selected from alkali metal, alkaline earth metal and a rare earth element. D includes: the element represented by X; and at least one element selected from Mg, Sc, Y, Ti, V, Zr, Hf, Zn, Al, Ga, In, Ge and Sn. E includes: Al; and at least one element selected from Zn, Al, Si, Ge and P. G includes O.

A phosphor according to a ninth aspect of the present invention is composed of either one of the inorganic oxide according to any one of the first to fourth aspects and the solid solution according to any one of the fifth to eighth aspects.

A phosphor according to a tenth aspect of the present invention is the phosphor according to the ninth aspect, wherein the inorganic oxide or the solid solution forms a main skeleton of a crystal.

A phosphor according to an eleventh aspect of the present invention is the phosphor according to either one the ninth and tenth aspects, wherein $Tb^{3+}$ contained in the inorganic oxide or the solid solution emits a fluorescent component.

A phosphor according to a twelfth aspect of the present invention is the phosphor according to any one of the ninth to eleventh aspects, which further contains $Ce^{3+}$ as an activator.

A phosphor according to a thirteenth aspect of the present invention is the phosphor according to the twelfth aspect, which further contains $Eu^{3+}$ as an activator. Moreover, $Eu^{3+}$ contained in the inorganic oxide or the solid solution emits the fluorescent component.

A phosphor according to a fourteenth aspect of the present invention is the phosphor according to the thirteenth aspect, wherein a number of Eu atoms is smaller than the number of Tb atoms in 1 mol of the phosphor.

A phosphor according to a fifteenth aspect of the present invention is the phosphor according to the twelfth aspect, wherein an excitation spectrum of the phosphor has an excitation band provided by $Ce^{3+}$.

A phosphor according to a sixteenth aspect of the present invention is the phosphor according to any one of the ninth to fifteenth aspects, wherein the phosphor is excited at a wavelength of 380 nm or more to less than 470 nm.

A phosphor according to a seventeenth aspect of the present invention is the phosphor according to any one of the ninth to sixteenth aspects, wherein a wavelength of an emission spectrum has a maximum value within a range of 535 nm or more to less than 560 nm. Moreover, a ⅕ spectrum width of the emission spectrum within the range of 535 nm or more to less than 560 nm is 3 nm or more to less than 30 nm.

A phosphor according to an eighteenth aspect of the present invention is the phosphor according to the thirteenth aspect, wherein a wavelength of an emission spectrum has a maximum value within a range of 600 nm or more to less than 628 nm.

A phosphor according to a nineteenth aspect of the present invention is the phosphor according to the ninth aspect, wherein the phosphor contains Tb, Ce and Eu, and is composed of a single-phase compound. Moreover, an excitation spectrum of the phosphor has a broad excitation band provided by absorption of $Ce^{3+}$, and the excitation band has an excitation peak within a range of 400 nm or more to less than 460 nm. Furthermore, an emission spectrum of the phosphor has a fluorescent component provided by at least either one of $Tb^{3+}$ and $Eu^{3+}$, and intensity of the emission spectrum at a wavelength of 575 nm is smaller than 10% of a maximum value of the emission spectrum.

A phosphor according to a twentieth aspect of the present invention is the phosphor according to the nineteenth aspect, wherein intensity of the emission spectrum at a wavelength of 520 nm is smaller than 30% of the maximum value of the emission spectrum.

A phosphor according to a twenty-first aspect of the present invention is the phosphor according to the nineteenth aspect, wherein the phosphor emits the fluorescent component of $Tb^{3+}$, and does not emit the fluorescent component of $Eu^{3+}$.

A phosphor according to a twenty-second aspect of the present invention is the phosphor according to the nineteenth aspect, wherein the phosphor emits the fluorescent components of both of $Tb^{3+}$ and $Eu^{3+}$.

A phosphor according to a twenty-third aspect of the present invention is the phosphor according to the nineteenth aspect, wherein the phosphor emits the fluorescent component of $Eu^{3+}$, and a maximum value of the fluorescent component of $Tb^{3+}$ is less than 10% of a maximum value of the fluorescent component of $Eu^{3+}$.

A phosphor according to a twenty-fourth aspect of the present invention is the phosphor according to the nineteenth aspect, wherein a number of Eu atoms contained in the phosphor is smaller than a number of Tb atoms contained in the phosphor.

A phosphor according to a twenty-fifth aspect of the present invention is a phosphor according to the ninth aspect, which contains at least $Ce^{3+}$ and $Tb^{3+}$ as emission centers. Then, an excitation spectrum of the phosphor has a broad excitation band provided by absorption of $Ce^{3+}$, and the excitation band has a peak within a range of 400 nm or more to less than 460 nm. Moreover, an emission spectrum of the phosphor emits a green fluorescent component provided by $Tb^{3+}$, and emission intensity of the emission spectrum at a wavelength of 520 nm is smaller than 30% of a maximum value of the emission spectrum.

A phosphor according to a twenty-sixth aspect of the present invention is a phosphor according to the ninth aspect, which contains at least $Ce^{3+}$, $Tb^{3+}$ and $Eu^{3+}$ as emission centers. Then, an excitation spectrum of the phosphor has a broad excitation band provided by absorption of $Ce^{3+}$, and the excitation band has a peak within a range of 400 nm or more to less than 460 nm. Moreover, an emission spectrum of the phosphor emits a green fluorescent component provided by $Tb^{3+}$ and/or a red fluorescent component provided by $Eu^{3+}$, and emission intensity of the emission spectrum at a wavelength of 520 nm is smaller than 30% of a maximum value of the emission spectrum.

A phosphor according to a twenty-seventh aspect of the present invention is the phosphor according to either one of the twenty-fifth and twenty-sixth aspects, wherein the intensity of the emission spectrum at the wavelength of 520 nm is smaller than 10% of the maximum value of the emission spectrum.

A phosphor according to a twenty-eighth aspect of the present invention is the phosphor according to any of the twenty-fifth to twenty-seventh aspects, wherein intensity of the emission spectrum at a wavelength of 575 nm is smaller than 10% of the maximum value of the emission spectrum.

A phosphor according to a twenty-ninth aspect of the present invention is the phosphor according to the twenty-sixth aspect, wherein, in the emission spectrum, the green fluorescent component provided by $Tb^{3+}$ or the red fluorescent component provided by $Eu^{3+}$ becomes the maximum value of the emission spectrum.

A light-emitting device according to a thirtieth aspect of the present invention includes the phosphor according to any one of the ninth to twenty-ninth aspects.

A light-emitting device according to a thirty-first aspect of the present invention is the light-emitting device according to the thirtieth aspect, which further includes a $Eu^{3+}$-activated phosphor.

A light-emitting device according to a thirty-second aspect of the present invention is the light-emitting device according to either one of the thirtieth and thirty-first aspect, wherein the phosphor is excited by short-wavelength visible light having a peak within a range of 380 nm or more to less than 470 nm.

A light-emitting device according to a thirty-third aspect of the present invention is the light-emitting device according to the thirty-second aspect, which further includes a solid-state light-emitting element that emits the short-wavelength visible light.

Advantageous Effects of Invention

The inorganic oxide of the present invention becomes the phosphor, which is capable of being excited by the short-wavelength visible light, and is capable of emitting the narrow-band green light and/or red light. Moreover, the light-emitting device of the present invention, which uses the inorganic oxide, is capable of emitting intense light, which includes the narrow-band green light component and/or red light component, by using the solid-state light-emitting element, which emits the short-wavelength visible light, as the excitation source.

DESCRIPTION OF EMBODIMENTS

Figure 1:
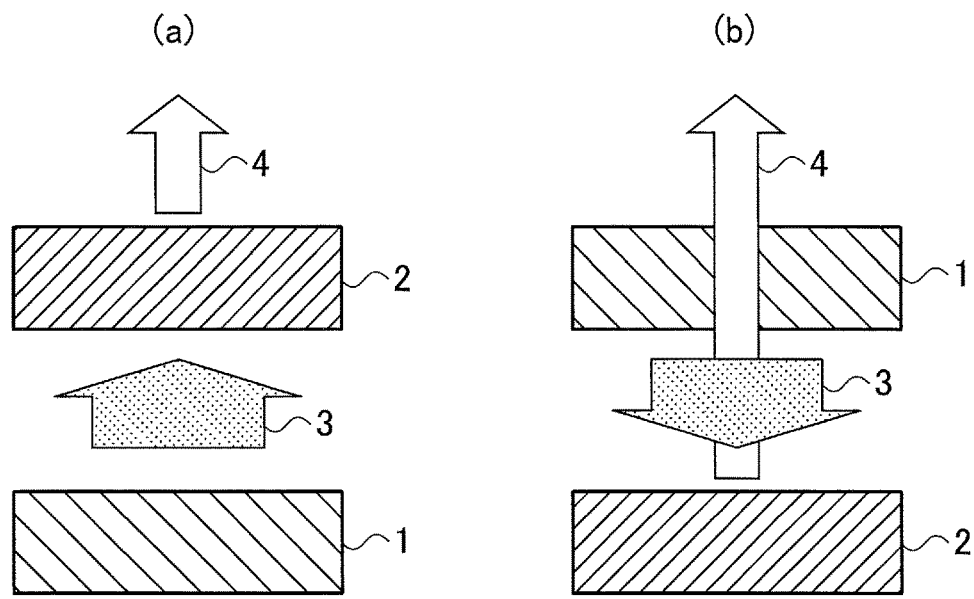
FIGS. 1(a) and 1(b) are schematic views for explaining a light-emitting device according to an embodiment of the present invention.

A description is made below in detail of a rare earth aluminum garnet-type inorganic oxide and a phosphor according to an embodiment of the present invention, and of a light-emitting device using the phosphor. Note that dimensional ratios of the drawings are exaggerated for convenience of explanation, and are sometimes different from actual ratios.

First, in general, "mineral" is a solid inorganic substance, which is naturally produced, and refers to one, in which a composition can be written by a chemical formula, an array of constituent elements is regular, that is, crystalline, and physical properties remain within a narrow range. A term opposite to this naturally produced mineral includes artificial mineral also called man-made mineral. The artificial mineral refers to one in which the same component, structure and texture as those of the naturally produced mineral are achieved by a chemical/physical method. Note that the artificial mineral sometimes includes an inorganic solid, in which a structure and an elemental composition are the same as those of the natural mineral, and a component or a composition is different from that of the natural mineral, and in addition, more broadly, also includes a general inorganic solid in some case.

Meanwhile, it is known that elements, which are similar in charge or ion radius to one another, are substitutable for one another while keeping the same crystal structure, and accordingly, form a group of minerals having similar chemical formulae. The matter that the substances having similar chemical compositions take the same crystal structure is referred to as "isomorphism" in the field of lithology and mineralogy. Therefore, mineral species belonging to the group of the garnet are compounds isomorphic to one another.

Moreover, it is also known that a different type of ions substitutes and enters specific sites in the crystal structure, and that the mineral species exhibit a broad composition change. A composition of the mineral can be easily expressed by a mixture ratio of minerals having compositions of both ends in the composition change. The mineral as described above is referred to as a "solid solution" since the mineral generates such a uniform phase as in mixture of solutions though the mineral is solid.

Then, in this description, a compound having the garnet structure, the compound containing at least a rare earth element, aluminum and oxygen as main components, is referred to as a "rare earth aluminum garnet-type inorganic oxide". Moreover, a rare earth aluminum garnet-type inorganic oxide, which functions as a phosphor, is referred to as a "rare earth aluminum garnet-type phosphor".

[Rare Earth Aluminum Garnet-Type Inorganic Oxide]

First, a description is made of the rare earth aluminum garnet-type inorganic oxide according to the embodiment of the present invention.

The rare earth aluminum garnet-type inorganic oxide according to this embodiment is an inorganic chemical substance created artificially with reference to natural mineral. Then, the inorganic oxide has a composition represented by General formula (1), in which a crystal structure is a garnet structure:

$$M_2LnX_2(AlO_4)_3 \tag{1}$$

where M includes calcium (Ca), Ln includes terbium (Tb), and X includes at least either one of zirconium (Zr) and hafnium (Hf). The inorganic oxide of this embodiment, which is represented by General formula (1) as described above, can exert novel fluorescent characteristics.

Moreover, the inorganic oxide of this embodiment is characterized in that the number of Tb moles in General formula (1) is 0.1 or more to 1 or less. In a case of using the inorganic oxide, in which the number of Tb atoms is set within this range, as a phosphor, then as will be described later, Tb functions as a emission center or a medium that transfers energy to Eu. Therefore, it becomes possible for the phosphor to efficiently emit green light and/or red light.

Specifically, the rare earth aluminum garnet-type inorganic oxide of this embodiment contains high-concentration Tb, and thereby functions as fluorescent mineral, that is, as an inorganic phosphor. Then, the number of Tb moles in General formula (1) is limited to 0.1 or more to 1 or less, whereby the rare earth aluminum garnet-type inorganic oxide becomes capable of exerting the function.

Here, in general, the inorganic compound has numerous modification examples. Moreover, as mentioned above, the mineral having the garnet structure also has numerous modification examples. Therefore, the rare earth aluminum garnet-type inorganic oxide according to this embodiment also incorporates numerous modification examples somewhat different from that in General formula (1) within the scope of not damaging the garnet structure. That is to say, an elemental composition of the inorganic oxide according to this embodiment is, for example, $Ca_2TbX_2(AlO_4)_3$. However, the inorganic oxide according to this embodiment is isomorphic to $Ca_2TbX_2(AlO_4)_3$, and is interpreted to include a modification example serving as an end-member of the solid solution. Note that the "end-member" is a term of the lithology, and refers to a component that forms a limit of the composition of the solid solution.

Then, as mentioned above, the element M in General formula (1) includes at least calcium (Ca). However, calcium is partially replaceable by an element that is other than calcium and can become divalent ions. Therefore, the element M in General formula (1) may include: Ca; and at least one element selected from the group consisting of alkaline earth metal, Fe(II), Mn, Zn, Cd, Co and Cu. Moreover, as the alkaline earth metal, Mg, Sr and Ba are particularly preferable.

In the inorganic oxide of this embodiment, preferably, calcium (Ca) occupies a majority of the element M in General formula (1). Here, the matter that Ca occupies a majority of the element M means that Ca atoms occupy a majority of an atom group that occupies the element M. The composition as described above is employed, whereby the inorganic oxide of this embodiment can function as a base material of a higher-efficiency phosphor or as the phosphor itself. Note that the element M may be occupied by only calcium.

Moreover, as mentioned above, the element Ln in General formula (1) includes at least terbium (Tb). However, terbium is partially replaceable by an element that is other than terbium and can become trivalent ions, and particularly, by a rare earth element. As the element that can become the trivalent ions, there are mentioned Sc, Y, La, Ce, Pr, Nd, Sm, Eu, Gd, Dy, Ho, Er, Tm, Yb, Lu, In, Sb, Bi and the like. Preferably, the element is at least one selected from Sc, Y, La, Ce, Pr, Nd, Sm, Eu, Gd, Dy, Ho, Er, Tm, Yb and Lu. Therefore, the element Ln in General formula (1) may include: Tb; and at least one element selected from the group consisting of Sc, Y, La, Ce, Pr, Nd, Sm, Eu, Gd, Dy, Ho, Er, Tm, Yb, Lu, In, Sb and Bi.

In a similar way to the above, in the inorganic oxide of this embodiment, preferably, terbium (Tb) occupies a majority of the element Ln in General formula (1). Here, the matter that Tb occupies a majority of the element Ln means that Tb atoms occupy a majority of an atom group that occupies the element Ln. The composition as described above is employed, whereby Tb itself becomes the emission center, and accordingly, the inorganic oxide of this embodiment can function as a base material of the higher-efficiency phosphor or as the phosphor itself.

Moreover, in a case where the element Ln in General formula (1) includes not only Tb but also Eu, numerous pieces of Tb will be present on peripheries of Eu. Therefore, efficiency of transferring energy from Tb to Eu is enhanced, thus making it possible to increase emission intensity of Eu. Note that the element Ln may be occupied by only terbium.

Furthermore, as mentioned above, the element X in General formula (1) includes at least either one of zirconium (Zr) and hafnium (Hf). However, zirconium and hafnium are partially replaceable by an element that is other than these elements and can become tetravalent ions. As the element that can become the tetravalent ions, Si, Ge, Ti, Sn, Pb and the like are mentioned, and Sn is preferable. Therefore, the element X in General formula (1) may include: at least either one of Zr and Hf; and at least one element selected from the group consisting of Si, Ge, Ti, Sn and Pb.

In a similar way to the above, in the inorganic oxide, preferably, zirconium (Zr) and/or hafnium (Hf) occupies a majority of the element X in General formula (1). Here, the matter that Zr and/or Hf occupies a majority of the element X means that Zr atoms and/or Hf atoms occupy a majority of an atom group that occupies the element X. The composition as described above is employed, whereby the inorganic oxide of this embodiment can function as the base material of the higher-efficiency phosphor or as the phosphor itself. Note that the element X may be occupied by only Zr and/or Hf.

Note that, in General formula (1) according to the inorganic oxide of this embodiment, the element M may be Ca, and the element Ln may be Tb, and the element X may be either one of Zr and Hf.

As such a compound, which is preferable as a fluorescent substance and isomorphic to the inorganic oxide of this embodiment, there are exemplified $Ca_2(Tb,Ce)Zr_2(AlO_4)_3$, $Ca_2(Y,Tb)Zr_2(AlO_4)_3$, and the like. Moreover, $Ca_2(La,Tb)Hf_2(AlO_4)_3$, $(Ca,Sr)_2(Y,Tb)(Zr,Hf)_2(AlO_4)_3$, $(Ca,Mg)_2TbZr_2(AlO_4)_3$, $Ca_2(Tb,Pr)Zr_2(AlO_4)_3$ and the like are also exemplified. Furthermore, $Ca_2(Tb,Ce,Eu)Zr_2(AlO_4)_3$, $Ca_2(Tb,Eu)Zr_2(AlO_4)_3$ and the like are also exemplified.

The inorganic oxide of this embodiment may form a solid solution with an inorganic compound, which is solid-solved with the inorganic oxide, and is different in composition from the inorganic oxide. Then, preferably, this solid solution has the garnet structure in a similar way to the inorganic oxide of this embodiment. The solid solution as described above can also become the rare earth aluminum garnet-type phosphor having the novel fluorescent characteristics.

Note that, in order to allow Tb, which is contained in the solid solution, to function as the emission center as mentioned above, preferably, the number of Tb moles in 1 mol of the solid solution is 0.1 mol or more to less than 3 mol.

Here, as the inorganic compound solid-solved in the inorganic oxide of this embodiment, a compound having the garnet structure is preferably, and particularly, a compound isomorphic to the above-described inorganic oxide is more preferable. In such a way, properties inherent in the inorganic compound become similar to those of the inorganic oxide, and accordingly, it becomes possible to easily form the solid solution of this embodiment, which has the garnet structure.

Note that, as the solid-solved inorganic compound, an europium compound, which has a composition represented by General formula (2): $Ca_2EuX_2(AlO_4)_3$, is preferable. The inorganic compound as described above is solid-solved in the above-described inorganic oxide, whereby a solid solution, which emits an $Eu^{3+}$ fluorescent component, can be formed. Note that the element X in General formula (2) is the same as the element X in General formula (1).

Moreover, as the solid-solved inorganic compound, a compound, which has a composition represented by General formula (3): $M_3Zr_2(AlO_4)_2(SiO_4)$, is also preferable. The inorganic compound as described above is solid-solved in the above-described inorganic oxide, whereby it becomes possible to move peak wavelengths of an excitation spectrum and an emission spectrum by approximately several nanometers to several ten nanometers. Note that the element M of General formula (3) is the same as the element M in General formula (1).

As mentioned above, it is known that the natural garnet is usually present as the solid solution of the plural types of garnets which become the end-members. Moreover, $Ca_2TbZr_2(AlO_4)_3$, $Ca_2TbHf_2(AlO_4)_3$ and the like in the inorganic oxide of this embodiment can be regarded as the end-members. Therefore, the inorganic oxide of this embodiment and the inorganic oxide have different garnet structures, and the solid solution with the inorganic compound that can become such an end-member is capable of obtaining numerous types.

Then, as mentioned above, the solid solution of this embodiment also has the garnet structure, and accordingly, the solid solution has a composition represented by General formula (4):

$$A_3D_2(EG_4)_3 \quad (4)$$

where an element A includes Ca and Tb. Moreover, at least either one of Ca and Tb in the element A is partially replaceable by an element that can become divalent or trivalent ions. Furthermore, at least either one of Ca and Tb in the element A can also be replaced by an element other than the element that can become the divalent or trivalent ions.

As an element that can partially replace Ca and Tb, an element is preferable, which can become monovalent to trivalent ions while being attended with charge compensation provided by at least either one of the element X in General formula (1) and tetrahedron other than a $(AlO_4)$ tetrahedron. In addition, an element is preferable, in which an ion radius is 0.6 Å or more to less than 1.7 Å, and particularly, 0.8 Å or more to less than 1.4 Å.

As such an element that can partially replace Ca and Tb, in which the ion radius is 0.6 Å or more to less than 1.7 Å, there can be mentioned: alkali metal such as Li, Na, K, Rb and Cs; and alkaline earth metal such as Mg, Ca, Sr and Ba. Moreover, as such an element, there can also be mentioned: rare earth elements such as Sc, Y, La, Ce, Pr, Nd, Sm, Eu, Gd, Tb, Dy, Ho, Er, Tm, Yb and Lu; and transition metal elements such as Mn, Fe, Co, Cu and Zn. Note that, in this description, the "ion radius" means an ion radius of Ahrens.

Therefore, preferably, the element A in General formula (4) includes: Ca and Tb; and at least one element selected from the alkali metal, the alkaline earth metal and the rare earth elements.

An element corresponding to the element D in General formula (4) is the element X in General formula (1). As mentioned above, the element X includes at least either one of Zr and Hf. Then, the element D can be partially replaced by the element that can become the tetravalent ions. Moreover, the element D can also be replaced by the element other than the element that can become the tetravalent ions. As an element that can partially replace the element D, an element is preferable, which can become divalent or trivalent ions while being attended with charge compensation provided by at least any one of Ca, Tb and the tetrahedron other than the $(AlO_4)$ tetrahedron. In addition, an element is preferable, in which an ion radius is 0.4 Å or more to less than 0.95 Å, and particularly, 0.5 Å or more to less than 0.8 Å.

As such an element in which the ion radius is 0.4 Å or more to less than 0.95 Å, there are mentioned: the rare earth elements such as Mg, Sc and Y; and transition metal and typical element metal, such as Ti, V, Cr, Mn, Fe, Co, Ni, Cu, Zn, Al, Ga, and In.

Therefore the element D in General formula (4) includes: the element X in General formula (1); and at least one element selected from Mg, Sc, Y, Ti, V, Zr, Hf, Zn, Al, Ga, In, Ge and Sn.

The $(AlO_4)$ tetrahedron in the inorganic oxide represented by General formula (1) corresponds to a tetrahedron $(EG_4)$ in General formula (4). Then, the above-described tetrahedron can be partially replaced by the tetrahedron other than the $(AlO_4)$ tetrahedron. As such a tetrahedron other than the above-described $(AlO_4)$ tetrahedron, there is mentioned a tetrahedron such as $(SiO_4)$, $(GeO_4)$, $(SiO_3N)$, $(ZnO_4)$, $(FeO_4)$, $(VO_4)$ and $(PO_4)$. Note that, in a case where the valence of the tetrahedron is deviated from the valence of the $(AlO_4)$ tetrahedron, that is, the negative pentavalent value in response to a form of the solid solution, then the solid solution is composed while being attended with charge compensation provided by any of Ca, Tb and the element X.

Therefore, preferably, the element E in General formula (4) includes: Al; and at least one element selected from Zn, Al, Si, Ge and P, and the element G includes O.

Note that, in the solid solution represented by General formula (4), preferably, an index of the partial replacement of A, D and (EG$_4$) is a half or less with respect to one piece of such a replacement target element, and moreover, is a half or less with respect to one piece of the (AlO$_4$) tetrahedron. In other words, preferably, Ca and Tb occupies a majority of the element A in General formula (4), more preferably, the element X occupies a majority of the element D, and still more preferably, (AlO$_4$) occupies a majority of (EG$_4$).

As described above, the inorganic oxide according to this embodiment is capable of forming the solid solution with the compound isomorphic to the inorganic oxide. Then, as mentioned above, the number of Tb moles in 1 mol of the solid solution is preferably 0.1 mol or more to less than 3 mol. However, from a viewpoint of enhancing light emission efficiency, the number of Tb moles in 1 mol of the solid solution is more preferably 0.2 mol or more to less than 2 mol, and is particularly preferably 0.4 mol or more to 1 mol or less.

As the inorganic compound that forms the solid solution with the inorganic oxide according to this embodiment as described above, Y$_3$Al$_2$(AlO$_4$)$_3$, Tb$_3$Al$_2$(AlO$_4$)$_3$ and Y$_3$Ga$_2$(AlO$_4$)$_3$ can be mentioned. Moreover, Ca$_2$YZr$_2$(AlO$_4$)$_3$, Ca$_2$EuZr$_2$(AlO$_4$)$_3$, Ca$_2$YHf$_2$(AlO$_4$)$_3$ and Ca$_3$Zr$_2$(AlO$_4$)$_2$(SiO$_4$) can also be mentioned. Furthermore, Ca$_2$LaZr$_2$(AlO$_4$)$_3$, Ca$_2$LuZr$_2$(AlO$_4$)$_3$, Ca$_2$LuHf$_2$(AlO$_4$)$_3$, Ca$_2$YSn$_2$(AlO$_4$)$_3$, Ca$_2$LaSn$_2$(AlO$_4$)$_3$ and the like can also be mentioned. However, the inorganic compound that forms the solid solution is not limited to these.

The solid solution of this embodiment may contain at least one element, which is selected from H, B, C, S, F, Cl and the like, as well as the above-mentioned elements. Moreover, the solid solution of this embodiment may contain nitrogen. That is to say, the element G in the tetrahedron (EG$_4$) in General formula (4) may contain nitrogen as well as oxygen, and the solid solution may be an oxynitride.

Here, preferably, the solid solution of this embodiment is a solid solution with a garnet structure, which is composed of at least two types of compounds taken as end-members. As a first compound (inorganic oxide) that becomes the end-member, for example, a terbium compound represented by General formula (1A): Ca$_2$TbX$_2$(AlO$_4$)$_3$ can be used. Then, as a second compound (inorganic oxide) that becomes the end-member, for example, the europium compound represented by General formula (2): Ca$_2$EuX$_2$(AlO$_4$)$_3$ can be used. Note that an element X is the same as the element X of General formula (1).

Moreover, also preferably, the solid solution of this embodiment is a solid solution with a garnet structure, which is composed of at least three types of compounds taken as end-members. As a first compound (inorganic oxide) that becomes the end-member, for example, the terbium compound represented by General formula (1A): Ca$_2$TbX$_2$(AlO$_4$)$_3$ can be used. Moreover, as a second compound (inorganic oxide) that becomes the end-member, for example, the europium compound represented by General formula (2): Ca$_2$EuX$_2$(AlO$_4$)$_3$ can be used. Then, as a third compound (inorganic oxide) that becomes the end-member, for example, a rare earth compound represented by General formula (2A): Ca$_2$Ln'X$_2$(AlO$_4$)$_3$ can be used. Here, an element Ln' is at least one element selected from the group consisting of Sc, Y, La, Ce, Pr, Nd, Sm, Gd, Dy, Ho, Er, Tm, Yb and Lu. Moreover, an element X is the same as the element X in General formula (1).

Furthermore, also preferably, the solid solution of this embodiment is a solid solution with a garnet structure, which is composed of at least the following three compounds taken as end-members. As a first compound (inorganic oxide) that becomes the end-member, for example, the terbium compound represented by General formula (1A): Ca$_2$TbX$_2$(AlO$_4$)$_3$ can be used. As a second compound (inorganic oxide) that becomes the end-member, for example, the europium compound represented by General formula (2): Ca$_2$EuX$_2$(AlO$_4$)$_3$ can be used. As a third compound (inorganic oxide) that becomes the end-member, for example, the zirconium compound represented by General formula (3): M$_3$Zr$_2$(AlO$_4$)$_2$(SiO$_4$) can be used. Note that the elements X and M are the same as the elements X and M in General formula (1).

Note that, in a case where the solid solution is composed of the terbium compound, the europium compound and the zirconium compound, which are described above, the solid solution can be represented by General formula (5): M$_{2+x}$Ln$_{1-x}$Zr$_2$(AlO$_4$)$_{3-x}$(SiO$_4$)$_x$. Here, preferably, the element Ln includes: Tb and Eu; and at least one rare earth element selected from, Sc, Y, La, Ce, Pr, Nd, Sm, Gd, Dy, Ho, Er, Tm, Yb and Lu. Particularly preferably, the element Ln is Tb, Eu and Ce. Moreover, the above-described x is preferably a numeric value that satisfies 0≤x<1, and is particularly preferably a numeric value that satisfies 0≤x<0.3.

Note that, preferably, the terbium compound in the above-described solid solution is Ca$_2$TbZr$_2$(AlO$_4$)$_3$, and preferably, the europium compound therein is Ca$_2$EuZr$_2$(AlO$_4$)$_3$. Then, the solid solution as described above can contain Ce. Therefore, the solid solution has an excitation band derived from electron energy transition of Ce$^{3+}$, and becomes capable of emitting the fluorescence.

Shapes of the rare earth aluminum garnet-type inorganic oxide and solid solution of this embodiment are not particularly limited. That is to say, in a similar way to the conventional YAG and the like, the rare earth aluminum garnet-type inorganic oxide and the solid solution are formable into compounds with a variety of shapes such as a single crystal shape, a thin film shape, a thick film shape, a block shape, a granular shape, a powder shape, a nano-particle shape, a ceramic shape, and a translucent ceramic shape. Moreover, in a similar way to the natural garnet, the inorganic oxide and solid solution of this embodiment are usable, for diverse purposes, as new industrial materials such as man-made jewel, abrasive, a ceramic material and an electron material.

It is possible to produce the rare earth aluminum garnet-type inorganic oxide of this embodiment by a method known in public. Specifically, in a similar way to YAG, the rare earth aluminum garnet-type inorganic oxide can be synthesized by using a solid phase reaction known in public.

First, a rare earth oxide (Sc$_2$O$_3$, Y$_2$O$_3$, La$_2$O$_3$, CeO$_2$, Pr$_6$O$_{11}$, Eu$_2$O$_3$, Gd$_2$O$_3$, Tb$_4$O$_7$, Lu$_2$O$_3$), which is a general ceramic raw material, is prepared. Moreover, alkali earth carbonate (CaCO$_3$, Al$_2$O$_3$, Ga$_2$O$_3$, ZrO$_2$, HfO$_2$) or the like is prepared. Next, such types of raw material powder are blended with each other so as to obtain a stoichiometric composition of a desired inorganic oxide or a composition approximate thereto, and are sufficiently mixed with each other by using a mortar, a ball mill or the like. Thereafter, the mixed raw materials are baked by an electric furnace by using a baking container such as an alumina crucible, whereby the inorganic oxide of this embodiment can be prepared. Note that, in an event of baking the mixed raw materials, it is preferable to heat the mixed raw materials at a baking temperature of 1500 to 1700° C. for a few hours under the atmosphere or a weakly reductive atmosphere.

[Rare Earth Aluminum Garnet-Type Phosphor]

Next, a description is made of the rare earth aluminum garnet-type phosphor according to the embodiment of the present invention.

The phosphor according to this embodiment contains the rare earth aluminum garnet-type inorganic oxide or the solid solution. Then, in the phosphor, preferably, the rare earth aluminum garnet-type inorganic oxide or the solid solution forms a main skeleton of the crystal. Then, in the above-mentioned inorganic oxide, as will be described later, the inorganic oxide itself has a function to emit the fluorescence, and accordingly, the phosphor of this embodiment uses the properties of the inorganic oxide exclusively. In other words, the phosphor of this embodiment is a compound, which is mainly composed of the above-described inorganic oxide or solid solution, and emits the fluorescence.

In general, the phosphor refers to a compound in which a part of the elements composing the crystal of the compound is replaced by the element that becomes the ions emitting the fluorescence. The ions having characteristics as described above are usually referred to as the "emission center". Then, as mentioned above, the inorganic oxide of this embodiment includes at least calcium (Ca), a predetermined amount or more of terbium (Tb), zirconium (Zr) and/or hafnium (Hf), aluminum (Al), and oxygen (O) as the constituent elements of the crystal. Tb is an element capable of forming $Tb^{3+}$ known as the emission center that emits the green light. Moreover, $Tb^{3+}$ is an ion, which is less likely to be quenched though a concentration thereof is increased, and is known as a emission center with less concentration quenching. Furthermore, $Tb^{3+}$ is an ion having a function as a sensitizer, which transfers energy to $Eu^{3+}$ and enables the light emission of $Eu^{3+}$. Therefore, the inorganic oxide of this embodiment and the solid solution containing the same have a function to emit the fluorescence from the inorganic oxide itself. That is to say, in the phosphor of this embodiment, at least $Tb^{3+}$ or $Eu^{3+}$ becomes the emission center, and $Tb^{3+}$ or $Eu^{3+}$ has characteristics of emitting the fluorescent component.

Heretofore, as a green phosphor with activated $Tb^{3+}$, which has been heretofore widely used for a light-emitting device, $Y_3Ga_2(AlO_4)_3:Tb^{3+}$, $Y_2SiO_5:Tb^{3+}$ and the like are present. Moreover, as the green phosphor, $(La,Ce)PO_4:Tb^{3+}$, $CeMgAl_{11}O_{19}:Tb^{3+}$, $(Gd,Ce)MgB_5O_{10}:Tb^{3+}$ and the like are also present. Then, in a case where $Tb^{3+}$ in the phosphor of this embodiment functions as the emission center, it becomes possible to realize a green phosphor having an emission spectrum equivalent to that of the conventional $Tb^{3+}$-activated green phosphor and the like.

Moreover, as a red phosphor with activated $Eu^{3+}$, which has been heretofore widely used for a light-emitting device, $Y_2O_3:Eu^{3+}$, $Y_2O_2S:Eu^{3+}$, $Y(P,V)_4:Eu^{3+}$ and the like are present. Then, in a case where $Eu^{3+}$ in the phosphor of this embodiment functions as the emission center, it becomes possible to realize a red phosphor having an emission spectrum equivalent to that of the conventional $Eu^{3+}$-activated red phosphor and the like.

As described above, the inorganic oxide of this embodiment has a function, which is not a little, to emit the fluorescence by itself. However, from a viewpoint of obtaining a higher-efficiency phosphor, it is preferable to modify the inorganic oxide of this embodiment as follows.

For example, transition metal such as Fe, Co, Ni, V, Cu, Cr and Ti is known as an element that forms an ion causing a decrease of emission intensity. Then, such an ion is usually called a killer center. Therefore, preferably, the phosphor of this embodiment does not contain these transition metals.

Moreover, more preferably, the phosphor of this embodiment allows the above-described inorganic oxide or solid solution to contain the ion that becomes the emission center. That is to say, the inorganic oxide of this embodiment and the solid solution containing the same include at least $Tb^{3+}$ as the emission center or the sensitizer. However, in a case of allowing the phosphor to emit light more efficiently, or in a case of changing a luminescent color, it is preferable to add another emission center in addition to $Tb^{3+}$. Moreover, even in a case where $Tb^{3+}$ does not radiate the fluorescence, in a case where such a emission center ion other than $Tb^{3+}$ radiates the fluorescence, then this case is incorporated in the technical scope of the present invention.

The emission center other than $Tb^{3+}$ just needs to be an ion capable of emitting the fluorescent by the electron energy transition in the crystals of a compound that functions as the base material of the phosphor, that is, the above-described inorganic oxide and solid solution. Specifically, it is preferable to use at least one of: $Sn^{3+}$, $Sb^{3+}$, $Tl^+$, $Pb^{2+}$ and $Bi^{3+}$ each of which is called an $ns^2$-type ion emission center; and $Cr^{3+}$, $Mn^{4+}$, $Mn^{2+}$ and $Fe^{3+}$, each of which is called a transition metal ion emission center. Moreover, it is also preferable to use $Ce^{3+}$, $Pr^{3+}$, $Nd^{3+}$, $Sm^{3+}$, $Eu^{3+}$, $Gd^{3+}$, $Dy^{3+}$, $Ho^{3+}$, $Er^{3+}$, $Tm^{3+}$, $Yb^{3+}$, $Sm^{2+}$, $Eu^{2+}$ and $Yb^{2+}$, each of which is called a rare earth ion emission center.

Note that, more preferably, the emission center in the phosphor of this embodiment is $Tb^{3+}$ and at least one ion selected from $Mn^{4+}$, $Mn^{2+}$, $Ce^{3+}$, $Pr^{3+}$ and $Eu^{3+}$. In this case, it becomes possible to easily obtain a phosphor that emits multi-purpose visible light components, that is, blue, blue green, green, yellow, orange, red and white. Particularly preferably, the emission center is $Tb^{3+}$ and at least one ion selected from $Mn^{2+}$, $Ce^{3+}$, $Pr^{3+}$ and $Eu^{3+}$. In this case, it becomes possible to obtain a phosphor that emits blue green light, green light, orange light, red light or white light, the phosphor being more frequently used for a display device and a lighting device.

As mentioned above, preferably, the phosphor of this embodiment contains, as activators, not only $Tb^{3+}$ but also at least one ion, which is other emission center than $Tb^{3+}$ and particularly, is selected from $Ce^{3+}$, $Pr^{3+}$, $Eu^{3+}$ and $Mn^{3+}$. For example, $Ce^{3+}$ not only functions as the emission center but also functions as a sensitizer of $Tb^{3+}$, and can increase the emission intensity of $Tb^{3+}$ having an emission line-like green component. Moreover, in a case where $Ce^{3+}$ is present in crystal lattices of the above-described inorganic oxide and solid solution, $Ce^{3+}$ has a function to absorb the short-wavelength visible light. Therefore, more preferably, the phosphor of this embodiment is allowed to not only contain $Tb^{3+}$ but also further contain $Ce^{3+}$. In such a way, an excitation spectrum of the phosphor comes to have the excitation band by $Ce^{3+}$. Then, $Ce^{3+}$ absorbs the short-wavelength visible light, and the light energy absorbed by $Ce^{3+}$ is moved to $Tb^{3+}$ efficiently, and accordingly, it becomes possible to perform wavelength conversion for the short-wavelength visible light into the emission line-like green light.

Moreover, $Ce^{3+}$ also functions as a sensitizer, and can increase emission intensity of $Pr^{3+}$ having an emission line-like red component. Therefore, also preferably, the phosphor of this embodiment contains not only $Tb^{3+}$ and $Ce^{3+}$ but also $Pr^{3+}$. In such a way, it becomes possible to obtain a phosphor that emits not only the light emission component of $Tb^{3+}$ but also a light emission component of $Pr^{3+}$. That is to say, it becomes possible to efficiently perform the wavelength conversion for the short-wavelength visible light into the emission line-like green light by $Tb^{3+}$ and the emission line-like red light by $Pr^{3+}$.

Furthermore, $Ce^{3+}$ also functions as a sensitizer of $Mn^{2+}$, and can increase emission intensity of $Mn^{2+}$ having an orange component with a wide spectrum width. Therefore, also preferably, the phosphor of this embodiment contains not only $Tb^{3+}$ and $Ce^{3+}$ but also $Mn^{2+}$. In such a way, it becomes possible to obtain a phosphor that emits not only the light emission component of $Tb^{3+}$ but also a light emission component of $Mn^{2+}$.

Meanwhile, $Tb^{3+}$ not only functions as the emission center but also functions as a medium of transferring energy to $Eu^{3+}$, that is, as a sensitizer of $Eu^{3+}$. Therefore, also preferably, the phosphor of this embodiment further contains $Eu^{3+}$ as a coactivator that becomes other emission center than $Tb^{3+}$. In such a way, it becomes possible to emit not only the light emission component of $Tb^{3+}$, which is contained in such a phosphor-composing inorganic oxide or solid solution, but also a light emission component of $Eu^{3+}$.

Moreover, the transfer of the energy from $Tb^{3+}$ to $Eu^{3+}$ is performed efficiently, and accordingly, the light emission containing the emission line-like red component can be obtained by addition of a small amount of $Eu^{3+}$. Then, for example, even a composition, in which the number of Eu atoms in 1 mol of the phosphor is smaller than the number of Tb atoms therein, becomes capable of emitting a fluorescent component formed of substantially only of $Eu^{3+}$. That is to say, the phosphor of this embodiment can also be configured to have such characteristics that at least $Eu^{3+}$ can become the emission center and that $Eu^{3+}$ can emit the fluorescent component.

Note that, in the case where the phosphor of this embodiment is allowed to contain not only $Tb^{3+}$ but also $Ce^{3+}$ as mentioned above, $Ce^{3+}$ can absorb the short-wavelength visible light, and the light energy absorbed by $Ce^{3+}$ can be moved to $Tb^{3+}$ efficiently. Therefore, if the phosphor containing $Tb^{3+}$ and $Eu^{3+}$ is allowed to further contain $Ce^{3+}$, then $Ce^{3+}$ can absorb the short-wavelength visible light, and the light energy absorbed by $Ce^{3+}$ can be moved to $Tb^{3+}$ efficiently. In addition, the light energy moved to $Tb^{3+}$ can be moved also to $Eu^{3+}$ efficiently. Therefore, the short-wavelength visible light absorbed by $Ce^{3+}$ is moved to $Eu^{3+}$ through $Tb^{3+}$, whereby it becomes possible to perform the wavelength conversion for the short-wavelength visible light into the emission line-like red light. Then, also in this case, the excitation spectrum of the phosphor that emits the emission line-like red light generated by $Eu^{3+}$ comes to have such a shape having the excitation band by $Ce^{3+}$.

As described above, in the rare earth aluminum garnet-type phosphor of this embodiment, preferably, the above-mentioned emission center is contained in the above-described inorganic oxide or solid solution, which contains Tb. In such a way, the above-described inorganic oxide and solid solution are easily excited by an external stimulus, for example, irradiation of a corpuscular ray ($\alpha$-ray, $\beta$-ray, electron beam) and an electromagnetic wave ($\gamma$-ray, X-ray, vacuum ultraviolet ray, ultraviolet ray, visible light ray) and the like, and become capable of emitting the fluorescence. Note that, if the fluorescence emitted from the phosphor of this embodiment is any electromagnetic wave selected from the ultraviolet ray, the visible light ray and the ultraviolet ray, then the fluorescence can be used for a light-emitting device to be described later; however, preferable fluorescence for practical use is the visible light. If the emitted fluorescence is the visible light, then the fluorescence can be widely used, for example, for the light-emitting device for the display device and the lighting device.

Then, as mentioned above, preferably, in the crystal lattice, the phosphor of this embodiment contains Ce, Pr, Eu and Mn as the rare earth element other than Tb. In such a way, a phosphor can be obtained, the phosphor emitting light, in which at least one light emission component of $Ce^{3+}$, $Pr^{3+}$, $Eu^{3+}$ and $Mn^{2+}$ is added to the light emission component of $Tb^{3+}$, in a case where the purple to blue short-wavelength visible light is irradiated thereonto. As a result, the phosphor of this embodiment becomes capable of arbitrarily controlling a color tone of the luminescent color.

Note that, in usual, it is frequent that the light emission component of $Ce^{3+}$ is observed in the phosphor containing $Ce^{3+}$ no matter how much the light emission component may be. In the case where the phosphor of this embodiment contains Ce, the main body of the fluorescent component by $Ce^{3+}$ is present in a wavelength range of 430 nm or more to less than 550 nm. Then, intensity of the emission spectrum of the phosphor at a wavelength, for example, of 520 nm can be reduced to more than 30% of a maximum value of the intensity of the emission spectrum, and particularly, can be reduced to more than 10% thereof. This matter means that, in the phosphor, a ratio of the blue green fluorescent component by $Ce^{3+}$ is low, and a ratio of the green fluorescent component by $Tb^{3+}$ or a ratio of the red fluorescent component by $Eu^{3+}$ can be increased.

Moreover, in the case where the phosphor of this embodiment contains Eu, then sometimes, the light emission component of $Tb^{3+}$ is not substantially observed. This matter means that, in the phosphor, the transfer of the energy from $Tb^{3+}$ to $Eu^{3+}$ is performed efficiently.

As mentioned above, in terms of the number of atoms, the number of Tb moles is 0.1 mol or more to less than 1 mol per mole of the inorganic oxide that becomes the phosphor. Then, the number of moles of the elements contained as the activators in the phosphor is smaller than the number of moles of the inorganic oxide, and preferably, is 0.01 mol or more to less than 0.3 mol per mole of the inorganic oxide.

As mentioned above, preferably, the phosphor of this embodiment is capable of being excited by the short-wavelength visible light. Preferably, the short-wavelength visible light is light that is present within a range of 380 nm or more to less than 470 nm. Particularly preferably, the short-wavelength visible light is either one of the purple light that has a maximum value of a spectral distribution within a range of 380 nm or more to less than 420 nm and the blue light that has a maximum value of a spectral distribution within a range of 420 nm or more to less than 470 nm. In such a way, it becomes easy to provide a light-emitting device, which is combined with the solid-state light-emitting element, as will be described later.

Moreover, in the phosphor of this embodiment, preferably, the emission spectrum of the emitted light has a maximum value within a range of 535 nm or more to less than 560 nm, and particularly, a range from 540 nm or more to less than 555 nm. Apparent brightness of the light depends on visual sensitivity, and visual sensitivity of a human eye has a maximum value at 555 nm. Then, even if the energy intensity of the light is the same, the green light within the above-described range looks relatively bright, and accordingly, a phosphor with higher visibility can be obtained by providing the maximum value within this range.

Then, in the phosphor of this embodiment, preferably, a full width at half maximum (FWHM) of the emission spectrum within the range of 535 nm or more to less than 560 nm is 3 nm or more to less than 30 nm. In particular, more preferably, a ⅕ spectrum width of the emission spectrum in the range of 535 nm or more to less than 560 nm is 3 nm or more to less than 30 nm, and particularly preferably, a ⅒ spectrum width thereof is 3 nm or more to less than 30 nm. Moreover, in the phosphor, preferably, a full width at half maximum of the emission spectrum within the range of 535 nm or more to less than 560 nm is 10 nm or more to less than 20 nm, and also preferably, a ⅕ spectrum width or a ⅒ spectrum width of the emission spectrum is 15 nm or more to less than 25 nm. The emission spectrum as described above has such an emission line-like green light component, in which the light components are concentrated on the wavelength range in which the visual sensitivity is high. Therefore, the phosphor as described above becomes capable of emitting a light component in which color purity of the green is good and the brightness is conspicuous. Note that the ⅕ spectrum width and the ⅒ spectrum width refer to widths of the above-described emission spectrum at positions where the intensity of the emission spectrum becomes ⅕ and ⅒ of the maximum value of the intensity when the maximum value is taken as 1.

Here, in the phosphor of this embodiment, preferably, intensity of the emission spectrum at a wavelength of 575 nm is smaller than 10%, and particularly 5% of the maximum value of the intensity of the emission spectrum. Moreover, the emission spectrum has a feature that, in the case where the phosphor contains $Ce^{3+}$ and $Tb^{3+}$ and emits the light emission components of both of $Ce^{3+}$ and $Tb^{3+}$, the maximum intensity within a range of 450 nm or more to less than 500 nm is smaller than 50% of a maximum intensity of a main bright line by $Tb^{3+}$. Here, the main bright line by $Tb^{3+}$ refers to a bright line that has a maximum value within the range of 535 nm or more to less than 560 nm.

Meanwhile, in the phosphor of this embodiment, also preferably, the emission spectrum has the maximum value within a range of 600 nm or more to less than 628 nm, and particularly, 600 nm or more to less than 620 nm. Light in which a ratio of the red light component is high becomes warm-colored light, and accordingly, the emission spectrum has the maximum value within this range, whereby a phosphor that emits light similar to light of an incandescent light bulb, which has been liked heretofore, can be obtained.

Here, the phosphor of this embodiment can be made as a phosphor composed of a single-phase compound, which has the garnet structure, and contains terbium (Tb) and cerium (Ce). Moreover, the phosphor of this embodiment can be made as a phosphor composed of a single-phase compound, which has the garnet structure, and contains terbium (Tb), cerium (Ce) and europium (Eu). Then, in the phosphor of this embodiment, which contains $Ce^{3+}$, the excitation spectrum has a broad excitation band provided by the absorption of $Ce^{3+}$, and the excitation band comes to have a peak within a range of 400 nm or more to less than 460 nm.

Moreover, in the phosphor of this embodiment, the emission spectrum of the phosphor containing $Tb^{3+}$ and $Ce^{3+}$ or the phosphor containing $Tb^{3+}$, $Ce^{3+}$ and $Eu^{3+}$ comes to have the fluorescent component provided by at least either one of $Tb^{3+}$ and $Eu^{3+}$. Then, preferably, in the emission spectrum, for example, the intensity thereof at the wavelength of 575 nm is smaller than 10%, and particularly 5% of the maximum value of the intensity of the emission spectrum. Moreover, in the emission spectrum, for example, the intensity thereof at the wavelength of 520 nm is smaller than 30%, and particularly 10% of the maximum value of the intensity of the emission spectrum. The phosphor as described above is combined with the solid-state light-emitting element that emits the purple or blue light, and thereby becomes capable of providing a light source that emits the emission line-like green fluorescent component derived from $Tb^{3+}$ and/or the emission line-like red fluorescent component derived from $Eu^{3+}$.

As described above, as the emission center, the phosphor of this embodiment can be made as the phosphor containing at least $Ce^{3+}$ and $Tb^{3+}$. Then, preferably, the excitation spectrum of the phosphor has the broad excitation band provided by the absorption of $Ce^{3+}$, and the excitation band comes to have a peak with the range of 400 nm or more to less than 460 nm. Moreover, preferably, the emission spectrum of the phosphor emits the green fluorescent component by $Tb^{3+}$, and the emission intensity of the emission spectrum at the wavelength of 520 nm is smaller than 30% of the maximum value of the emission spectrum.

Moreover, as the emission center, the phosphor of this embodiment can be made as the phosphor containing at least $Ce^{3+}$, $Tb^{3+}$, and $Eu^{3+}$. Then, preferably, the excitation spectrum of the phosphor has the broad excitation band provided by the absorption of $Ce^{3+}$, and the excitation band comes to have a peak within the range of 400 nm or more to less than 460 nm. Moreover, preferably, the emission spectrum of the phosphor emits the green fluorescent component by $Tb^{3+}$ and/or the red fluorescent component by $Eu^{3+}$, and the emission intensity of the emission spectrum at the wavelength of 520 nm is smaller than 30% of the maximum value of the emission spectrum.

Note that, sometimes, the emission spectrum of the above-described phosphor comes to have a shape, in which the fluorescent component by $Tb^{3+}$ and/or $Eu^{3+}$ and the fluorescent component by $Ce^{3+}$ overlap each other. In this case, the main body of the fluorescent component by $Ce^{3+}$ is located in the wavelength range of 430 nm or more to less than 550 nm.

Moreover, the above-described phosphor containing $Tb^{3+}$ and $Eu^{3+}$ can also be made as a phosphor that emits the fluorescent component of $Tb^{3+}$, and does not emit the fluorescent component of $Eu^{3+}$ by adjusting contents of Tb and Eu. Moreover, the phosphor can be made as a phosphor that emits the fluorescent components of both of $Tb^{3+}$ and $Eu^{3+}$. Then, the above-described phosphor containing $Tb^{3+}$ and $Eu^{3+}$ can emit the fluorescent component of $Eu^{3+}$, and further, can set the maximum value of the intensity in the fluorescent component of $Tb^{3+}$ at less than 10% of the maximum value of the intensity in the fluorescent component of $Eu^{3+}$. Furthermore, in the above-described phosphor containing $Tb^{3+}$ and $Eu^{3+}$, with regard to the emission spectrum, the green fluorescent component by $Tb^{3+}$ or the red fluorescent component by $Eu^{3+}$ are enabled to reach the maximum value of the emission spectrum.

As mentioned above, in the phosphor of this embodiment, which contains europium and emits the fluorescent component of $Eu^{3+}$, the transfer of the energy from $Tb^{3+}$ to $Eu^{3+}$ occurs efficiently. Therefore, even in the case where the number of europium atoms contained in the phosphor is smaller than the number of terbium atoms contained therein, the emission line-like red fluorescent component can be allowed to emit light efficiently.

The phosphor of this embodiment is characterized in that the above-described inorganic oxide functions as the phosphor. Then, the phosphor composed of the solid solution that includes, as the end-members, at least two types of compounds which are the above-described terbium compound and the above-described europium compound can emit at least the fluorescent component derived from such electron energy transition of $Eu^{3+}$. Moreover, the phosphor of this embodiment can also emit the fluorescent component derived from the electron energy transition of $Tb^{3+}$.

Note that, with regard to the fluorescent component derived from the electron energy transition of $Eu^{3+}$, preferably, the main bright line of the fluorescent component derived from $Eu^{3+}$ is present within the wavelength range of 600 nm or more to less than 628 nm. Then, preferably, a maximum height of the bright line present within a wavelength range of 700 nm or more to less than 720 nm is set to less than 60%, and particularly, less than 40% of a maximum height of the above-described main bright line. Note that the above-described electron energy transition of $Eu^{3+}$ refers to the $^5D_0 \rightarrow {}^7F_j$ transition by the $4f^6$ electron of $Eu^{3+}$.

As mentioned above, the phosphor of this embodiment contains at least the terbium ion ($Tb^{3+}$) as the emission center. However, preferably, the emission center contains not only the terbium ion ($Tb^{3+}$) but also the cerium ion ($Ce^{3+}$), and preferably, contains the europium ion ($Eu^{3+}$) according to needs. In this case, the emission spectrum of the phosphor has characteristic shapes shown in FIG. 10, FIG. 11 and FIG. 13, which will be described later. Here, a description is made of a mechanism the phosphor of this embodiment shows the characteristic spectra of FIG. 10, FIG. 11 and FIG. 13.

In general, it is known that the $Ce^{3+}$-activated phosphor converts absorbed light into long-wavelength light, and that the light thus converted has a wide spectral distribution. In contrast, the $Tb^{3+}$-activated phosphor or the $Eu^{3+}$-activated phosphor converts the absorbed light into the long-wavelength light; however, the light thus converted is composed of a plurality of bright lines. It is known that the $Tb^{3+}$-activated phosphor has the maximum value of the intensity within a wavelength range of 540 nm or more to less than 560 nm in the emission spectrum. Moreover, it is known that the $Eu^{3+}$-activated phosphor has the maximum value of the intensity within a wavelength range of 580 nm or more to less than 650 nm in the emission spectrum.

Moreover, for example, in the phosphor activated by both of $Ce^{3+}$ and $Tb^{3+}$, it is known that at least a part of the energy absorbed by $Ce^{3+}$ moves to $Tb^{3+}$ by a mechanism called resonance transfer. In order that the energy movement by the resonance transfer can occur, in usual, it is necessary that the emission spectrum of $Ce^{3+}$ and an absorption spectrum of $Tb^{3+}$ overlap each other. Then, heretofore, by using the energy transfer from $Ce^{3+}$ to $Tb^{3+}$, a green phosphor for a lamp has been developed. As such a green phosphor, for example, $(La,Ce,Tb)PO_4$, $(Ce,Tb)MgAl_{11}O_{19}$ and $(Gd,Ce,Tb)MgB_5O_{10}$ are mentioned. However, in a case of the green phosphor for a lamp, the peak of the excitation spectrum is present in a vicinity of 254 nm, and the peak of the light emission component of $Ce^{3+}$ is located within a wavelength range of less than 450 nm.

Note that, with regard to the resonance transfer from $Ce^{3+}$ to $Tb^{3+}$, even if $Ce^{3+}$ emits the blue to blue green light with the wavelength of 450 nm or more to 500 nm or less, the emission spectrum of $Ce^{3+}$ and the absorption spectrum of $Tb^{3+}$ can overlap each other. Therefore, in principle, the energy transfer from $Ce^{3+}$ to $Tb^{3+}$ is possible. That is to say, even in a case where the $Ce^{3+}$-activated phosphor, which has the emission peak within the range of 450 nm or more to 500 nm or less, is coactivated by $Tb^{3+}$, the resonance transfer from $Ce^{3+}$ to $Tb^{3+}$ occurs since the emission spectrum of $Ce^{3+}$ and the absorption spectrum of $Tb^{3+}$ overlap each other. Moreover, in a case where the concentration of $Tb^{3+}$ is high, an inter-ion distance between $Tb^{3+}$ and $Ce^{3+}$ is shortened, and accordingly, almost all of the energy absorbed by $Ce^{3+}$ moves to $Tb^{3+}$, and linear light emission caused by $Tb^{3+}$ appears as a main body. Further, even in a case where the concentration of $Tb^{3+}$ is low, a major part of the energy absorbed by $Ce^{3+}$ moves to $Tb^{3+}$. Therefore, a broad light emission component, which is caused by $Ce^{3+}$ and has a peak within the range of 450 nm or more to 500 nm or less, and a linear light emission component, which is caused by $Tb^{3+}$ and is located within the range of 540 nm or more to less than 560 nm, come to be observed.

Meanwhile, it is known that, for example, in the phosphor activated by both of $Tb^{3+}$ and $Eu^{3+}$, the energy moves from $Tb^{3+}$ to $Eu^{3+}$ by the resonance transfer. Note that, in general, it is known that an overlap between the emission spectrum of $Tb^{3+}$ and the absorption spectrum of $Eu^{3+}$ is small. Accordingly, in order to increase energy transfer efficiency from $Tb^{3+}$ to $Eu^{3+}$, it becomes necessary to increase the content of either one thereof in the phosphor so as to shorten a distance between $Tb^{3+}$ and $Eu^{3+}$.

As described above, the resonance transfer occurs from $Ce^{3+}$ to $Tb^{3+}$, and the resonance transfer also occurs from $Tb^{3+}$ to $Eu^{3+}$. As described above, in the phosphor activated together by $Ce^{3+}$, $Tb^{3+}$ and $Eu^{3+}$, energy transfer from $Ce^{3+}$ to $Eu^{3+}$ occurs via $Tb^{3+}$, which is taken as a medium, by the energy transfer from $Ce^{3+}$ to $Tb^{3+}$, and further from $Tb^{3+}$ to $Eu^{3+}$.

In the case of the phosphor of this embodiment, by this mechanism, the light emission component of $Tb^{3+}$ and/or $Eu^{3+}$ is superimposed on the broad light emission component of $Ce^{3+}$, which has the peak within the range of 450 nm or more to less than 500 nm and has relatively small intensity. As a result, the phosphor of this embodiment exhibits the characteristic emission spectrum that has the linear emission peaks within the wavelength ranges of 535 nm or to less than 560 nm and/or 580 nm or more to less than 650 nm.

Moreover, $Ce^{3+}$ not only functions as the emission center but also functions as the sensitizer of $Tb^{3+}$, and can enhance the emission intensity of $Tb^{3+}$ having the emission line-like green component. Moreover, $Tb^{3+}$ not only functions as the emission center but also functions as the sensitizer of $Eu^{3+}$, and can enhance the emission intensity of $Eu^{3+}$ having the emission line-like red component. Meanwhile, in the case where $Ce^{3+}$ is present in the crystal lattice of the inorganic oxide, $Ce^{3+}$ has a function to absorb the short-wavelength visible light. Therefore, in the phosphor of this embodiment, $Ce^{3+}$ and $Tb^{3+}$ and $Eu^{3+}$ that is added according to needs are allowed to coexist, whereby $Ce^{3+}$ absorbs the short-wavelength visible light, and the light energy absorbed by $Ce^{3+}$ is moved to $Tb^{3+}$ and/or $Eu^{3+}$ efficiently. As a result, it becomes possible to perform the wavelength conversion for the short-wavelength visible light into the emission line-like green light and/or the emission line-like red light.

The phosphor of this embodiment is a phosphor characterized in emitting light by the above-described light emission mechanism, and is a phosphor having a new function that has not been present heretofore. Here, the new function refers to a function to emit the green fluorescent component by $Tb^{3+}$ and/or the red fluorescent component by $Eu^{3+}$ as main light emission components, in which the broad excitation peak by $Ce^{3+}$ is provided within the wavelength range of the short-wavelength visible light, and particularly, within the wavelength range of 400 nm or more to less than 460 nm.

Preferably, the phosphor of this embodiment absorbs at least either of the purple light present within the range of 380 nm or more to less than 420 nm and the blue light within the range of 420 nm or more to less than 470 nm. In such a way, the short-wavelength visible light can be subjected to the wavelength conversion into the light having the maximum value of the emission spectrum within the range of 470 nm or more to 780 nm or less.

Note that the phosphor of this embodiment can be appropriately mixed with a solvent such as water and an organic solvent, resin, liquid glass, and the like, and can be used in a form of slurry, paste, sol and gel.

As mentioned above, in the general phosphor, a small amount of the element serving as the emission center is added into the compound that functions as the base material, and the element added by the small amount emits the fluorescence. For example, $Ca_2(Tb,Ce)Zr_2(AlO_4)_3$, $Ca_2(Tb,Ce,Eu)Zr_2(AlO_4)_3$ and the like, which are according to this embodiment, are similar to the general phosphor in a point of being composed in such a manner that a small amount of the specific ion is added into the inorganic oxide that functions as the base material. However, the phosphor of this embodiment has characteristics which have not been present heretofore, the characteristics being that the ion (for example, $Tb^{3+}$ ion) that forms the crystal lattice of the base material comes to emit the fluorescence by the specific ion ($Ce^{3+}$ ion) added by the small amount.

[Light-Emitting Device]

Next, a description is made of the light-emitting device according to the embodiment of the present invention. The light-emitting device of this embodiment is characterized by including the above-described rare earth aluminum garnet-type phosphor. As mentioned above, the phosphor of this embodiment is capable of being excited by the short-wavelength visible light, and emits the light of narrow-band emission spectrum. Therefore, the light-emitting device of this embodiment becomes capable of outputting light, which has a narrow-band emission spectrum component, by combining a light-emitting element, which emits the short-wavelength visible light, and the above-described phosphor with each other.

The light-emitting device according to this embodiment broadly embraces electronic devices including a function to emit light, and is not particularly limited as long as the electronic devices emit some light. That is to say, the light-emitting device of this embodiment is a light-emitting device, which uses at least the phosphor of this embodiment, and further uses the fluorescence emitted by the phosphor at least as output light.

More specifically, the light-emitting device of this embodiment combines a solid-state light-emitting element, which emits the short-wavelength visible light, and the above-described phosphor with each other. Then, the phosphor absorbs the short-wavelength visible light emitted by the solid-state light-emitting element, and performs the wavelength conversion for the absorbed short-wavelength visible light into light with a wavelength longer than that of the short-wavelength visible light.

Moreover, preferably, the excitation spectrum of the phosphor has a maximum in a short-wavelength visible range of 380 nm or more to less than 470 nm, and particularly, 400 nm or more to less than 460 nm. Specifically, in a case of measuring the excitation spectrum within a range of 220 nm or more to less than 470 nm, and particularly, 300 nm or more to less than 470 nm, preferably, the excitation spectrum of the phosphor has the maximum value within the short-wavelength visible range of 380 nm or more to less than 470 nm, and particularly, 400 nm or more to less than 460 nm.

Moreover, preferably, the emission spectrum of the phosphor includes the spectrum component derived from the electron energy transition of $Tb^{3+}$. Furthermore, in the emission spectrum of the above-described phosphor, preferably, the full width at half maximum of the spectrum component within the range of 535 nm or more to less than 560 nm, preferably the ⅕ spectrum width thereof, more preferably the ¹⁄₁₀ spectrum width thereof is 3 nm or more to less than 30 nm. Then, preferably, the maximum intensity of the emission spectrum component within the range of 450 nm or more to less than 500 nm is smaller than 50%, and particularly, 40% of the maximum intensity of the spectrum component within the range of 535 nm or more to less than 560 nm. Note that the energy transition of $Tb^{3+}$ refers to the $^5D_4 \rightarrow {}^7F_j$ transition by the $4f^8$ electron of $Tb^{3+}$.

Meanwhile, also preferably, the emission spectrum of the phosphor includes the spectrum component derived from the electron energy transition of $Eu^{3+}$. Moreover, the emission spectrum of the phosphor can also have the maximum value within the range of 600 nm or more to less than 628 nm. That is to say, the emission spectrum of the phosphor can be made as the red light, in which the main bright line of the fluorescent component is present within the wavelength range of 600 nm or more to less than 628 nm. Note that the energy transition of $Eu^{3+}$ refers to the $^5D_0 \rightarrow {}^7F_j$ transition by the $4f^6$ electron of $Eu^{3+}$.

Heretofore, there have been numerous light-emitting devices using the phosphor, and for example, a fluorescent lamp, an electron tube, a plasma display panel (PDP), a white LED, and further, a detector using the phosphor apply to the light-emitting devices. In a broad sense, an illumination light source, an illumination device, a display device and the like, which use the phosphor, are the light-emitting devices, and projector provided with a laser diode, a liquid crystal display provided with an LED backlight, and the like are also regarded as the light-emitting devices. Here, the light-emitting device of this embodiment can be classified depending on types of the fluorescence emitted by the phosphor, and accordingly, such classification is described.

The fluorescence phenomenon for use in the electronic devices is academically classified into some categories, and is distinguished by terms such as photoluminescence, cathodeluminescence, and electroluminescence.

The photoluminescence refers to fluorescent emitted by the phosphor when the phosphor is irradiated with an electromagnetic wave. Note that the term "electromagnetic wave" generically refers to the X-ray, the ultraviolet ray, the visible light, the infrared ray and the like. The cathodeluminescence refers to fluorescence emitted by the phosphor when the phosphor is irradiated with an electron beam. Moreover, the electroluminescence refers to fluorescence emitted by the phosphor when electrons are injected into the phosphor or an electric field is applied thereto. As fluorescence similar to the photoluminescence in principle, there is a term "thermoluminescence", which refers to fluorescence emitted by the phosphor when the phosphor is heated. Moreover, as fluorescence similar to the cathodeluminescence in principle, there is a term "radioluminescence", which refers to fluorescence emitted by the phosphor when the phosphor is irradiated with a radiation.

As previously mentioned, light-emitting device of this embodiment uses the fluorescence, which is emitted by the above-mentioned rare earth aluminum garnet-type phosphor, at least as the output light. Then, the fluorescence mentioned herein can be classified at least as mentioned above, and accordingly, the fluorescence can be replaced by at least one fluorescence phenomenon selected from the above-described pieces of luminescence.

Note that, as typical examples of the light-emitting device that uses the photoluminescence of the phosphor as the output light, there are mentioned an X-ray image intensifier, a fluorescent lamp, a white LED, a semiconductor laser projector using the phosphor and a laser diode, and a PDP. Moreover, as typical examples of the light-emitting device that uses the cathodeluminescence as the output light, an electron tube, a fluorescent character display tube and a field emission display (FED) are mentioned. Furthermore, as typical examples of the light-emitting device that uses the electroluminescence as the output light, there are mentioned an inorganic electroluminescence display (inorganic EL), a light-emitting diode (LED), a semiconductor laser (LD) and an organic electroluminescence device (OLED). Then, as the light-emitting device that uses the electroluminescence from the phosphor of this embodiment, for example, an inorganic electroluminescence display can be mentioned.

A description is made below of the light-emitting device of this embodiment with reference to the drawings. FIGS. 1(a) and 1(b) show an outline of the light-emitting device according to this embodiment. In FIG. 1(a) and FIG. 1(b), an excitation source 1 is a light source that generates primary light for exciting the phosphor 2 of this embodiment. As the excitation source 1, a radiation device can be used, which emits the corpuscular ray such as the α-ray, the β-ray and the electron beam and the electromagnetic wave such as the γ-ray, the X-ray, the vacuum ultraviolet ray, the ultraviolet ray and the visible light (particularly, the short-wavelength visible light such as the purple light and the blue light). Moreover, as the excitation source 1, there can be used a generation device of a variety of radiations, an electron beam radiation device, a discharge light generation device, a solid-state light-emitting element, the solid-state light-emitting device and the like. As representatives of the excitation source 1, there are mentioned an electron gun, an X-ray tube, a rare gas discharge device, a mercury discharge device, a light-emitting diode, a laser light generation device including a semiconductor laser, an inorganic or organic electroluminescence element and the like.

Moreover, as shown in FIG. 1(a) and FIG. 1(b), output light 4 is an excitation line emitted by the excitation source 1 or fluorescence emitted by the phosphor 2 excited by excitation light 3. Then, the output light 4 is used as illumination light or display light in the light-emitting device.

FIG. 1(a) shows a light-emitting device with a structure in which the output light 4 from the phosphor 2 is emitted in a direction of irradiating the excitation line or the excitation light 3 onto the phosphor 2. Note that, as the light-emitting device shown in FIG. 1(a), a white LED light source, a fluorescent lamp, an electron tube and the like are mentioned. Meanwhile, FIG. 1(b) shows a light-emitting device with a structure in which the output light 4 from the phosphor 2 is emitted in a direction reverse to the direction of irradiating the excitation line or the excitation light 3 onto the phosphor 2. As the light-emitting device shown in FIG. 1(b), a plasma display device, a light source device using a phosphor wheel added with a reflecting plate, a projector and the like are mentioned.

Preferable specific examples of the light-emitting device of this embodiment are a semiconductor light-emitting device, an illumination light source, an LED backlight-added liquid crystal panel, an LED projector, a laser projector, and the like, each of which is composed by using the phosphor. Then, the particularly preferable light-emitting device has a structure of exciting the phosphor by the short-wavelength visible light, in which the solid-state light-emitting element emits the short-wavelength visible light.

A description is made below in detail of specific examples of the semiconductor light-emitting device and the light source device for a projector, each of which serves as the light-emitting device according to this embodiment.

<Semiconductor Light-Emitting Device>

Figure 2:
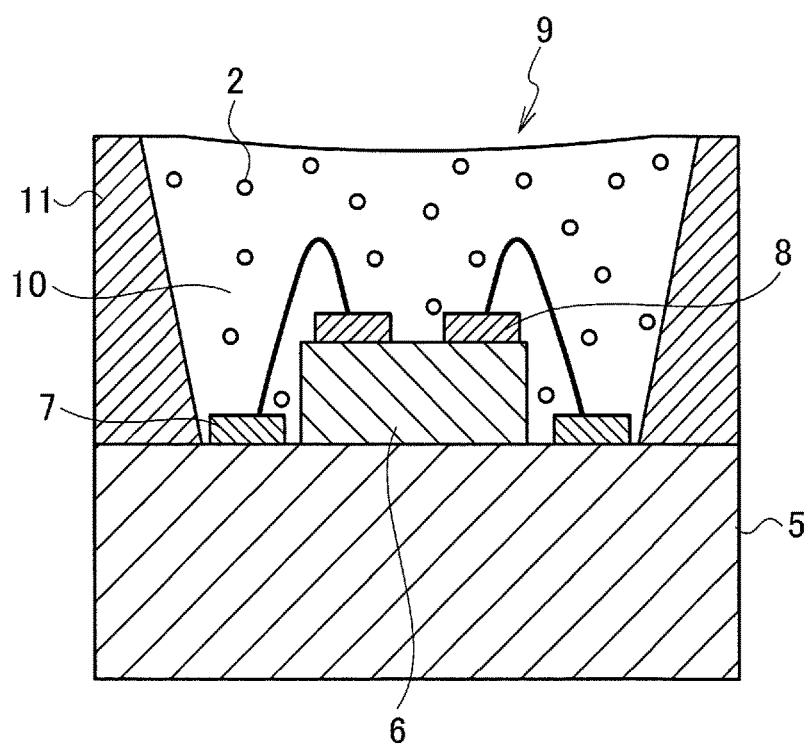
FIG. 2 is a cross-sectional view schematically showing an example of a semiconductor light-emitting device according to the embodiment of the present invention.

FIG. 2 is a cross-sectional view schematically showing the semiconductor light-emitting device as a specific example of the light-emitting device according to this embodiment. FIG. 2 is a cross-sectional view; however, hatching showing a cross section of translucent resin 10 is omitted in consideration of visibility of the drawing.

In FIG. 2, a substrate 5 serves as a base for fixing a solid-state light-emitting element 6. Then, the substrate 5 is composed of ceramics such as $Al_2O_3$ and AlN, metal such as Al and Cu, glass, and resin such as silicone resin and filler-contained silicone resin.

Moreover, wiring conductors 7 are provided on the substrate 5, and power feed electrodes 8 of the solid-state light-emitting element 6 and the wiring conductors 7 are electrically connected to each other by using gold wires and the like, whereby power is fed to the solid-state light-emitting element 6.

The solid-state light-emitting element 6 as a light source that generates the primary light is an electro-optic conversion element that converts electric energy into light energy such as a near-infrared ray and a purple or blue light by supply of power, which applies a voltage of at least any one selected from a direct current, an alternating current and a pulse. As the solid-state light-emitting element 6, there can be used an LED, an LD, an inorganic electroluminescence (EL) element, an organic EL element and the like. In particular, in order to obtain primary light with a high output and a narrow spectrum half width, the LED or the LD is preferable as the solid-state light-emitting element 6. Note that FIG. 2 shows a configuration in a case where an LED is employed, which uses an InGaN-based compound as a light-emitting layer.

A wavelength conversion layer 9 includes the phosphor 2 made of the fluorescent substance, and performs the wavelength conversion for the primary light, which is emitted by the solid-state light-emitting element 6, into light that has moved relatively to a long wavelength side. Moreover, as shown in FIG. 2, the wavelength conversion layer 9 is surrounded by a sidewall 11, and further, particles of the phosphor according to this embodiment are dispersed into the translucent resin 10. Note that the wavelength conversion layer 9 in the semiconductor light-emitting device of this embodiment can be composed by containing the phosphor in a resin fluorescent film, translucent fluorescent ceramics, fluorescent glass and the like.

For the wavelength conversion layer 9, the phosphor according to this embodiment can be used solely as the phosphor 2; however, a phosphor different from the phosphor according to this embodiment may be contained according to needs. Moreover, plural types of the rare earth aluminum garnet-type phosphors, which are different from one another in either one of the luminescent color and the composition, may be used in combination.

The phosphor, which can be used for the wavelength conversion layer 9 and is different from the phosphor of this embodiment, is not particularly limited as long as the phosphor absorbs the primary light emitted by the solid-state light-emitting element 6 and performs the wavelength conversion for the primary light into the light that has moved relatively to the long wavelength side. The phosphor can be appropriately selected from a variety of phosphors which emit the blue light, the green blue light, the blue green light, the green light, the yellow light, the orange light and the red light as the luminescent color, whereby the semiconductor light-emitting device is enabled to emit output light of a desired color.

As the phosphor for the semiconductor light-emitting device in the case where the LED or the LD is used as the solid-state light-emitting element 6, there can be used not only the phosphor of this embodiment but also an oxide-based phosphor such as an oxide and an acid halide, which are activated by at least either of $Eu^{2+}$ and $Ce^{3+}$. Moreover, as the phosphor, there can be used a nitride-based phosphor such as a nitride and an oxynitride, which are activated by at least either of $Eu^{2+}$ and $Ce^{3+}$, or a sulfide-based phosphor such as a sulfide and an oxysulfide, which are activated thereby.

Specifically, as the blue phosphor, there are mentioned $BaMgAl_{10}O_{17}:Eu^{2+}$, $CaMgSi_2O_6:Eu^{2+}$, $Ba_3MgSi_2O_8:Eu^{2+}$, $Sr_{10}(PO_4)_6Cl_2:Eu^{2+}$ and the like. As the green blue or blue green phosphor, there are mentioned $Sr_4Si_3O_8Cl_4:Eu^{2+}$, $Sr_4Al_{14}O_{24}:Eu^{2+}$, $BaAl_8O_{13}:Eu^{2+}$ and $Ba_2SiO_4:Eu^{2+}$. Moreover, as the green blue or the blue green phosphor, there are mentioned $BaZrSi_3O_9:Eu^{2+}$, $Ca_2YZr_2(AlO_4)_3:Ce^{3+}$, $Ca_2YHf_2(AlO_4)_3:Ce^{3+}$, $Ca_2YZr_2(AlO_4)_3:Ce^{3+}$ and $Tb^{3+}$. As the green phosphor, there are mentioned $(Ba,Sr)_2SiO_4:Eu^{2+}$, $Ca_8Mg(SiO_4)_4Cl_2:Eu^{2+}$, $Ca_8Mg(SiO_4)_4Cl_2:Eu^{2+}$ and $Mn^{2+}$. Moreover, as the green phosphor, there are mentioned $BaMgAl_{10}O_{17}:Eu^{2+}$ and $Mn^{2+}$, $CeMgAl_{11}O_{19}:Mn^{2+}$, $Y_3Al_2(AlO_4)_3:Ce^{3+}$ and $Lu_3Al_2(AlO_4)_3:Ce^{3+}$. Furthermore, as the green phosphor, there are mentioned $Y_3Ga_2(AlO_4)_3:Ce^{3+}$, $Ca_3Sc_2Si_3O_{12}:Ce^{3+}$, $CaSc_2O_4:Ce^{3+}$, $\beta$-$Si_3N_4:Eu^{2+}$ and $SrSi_2O_2N_2:Eu^{2+}$. As the green phosphor, there are mentioned $Ba_3Si_6O_{12}N_2:Eu^{2+}$, $Sr_3Si_{13}Al_3O_2N_{21}:Eu^{2+}$, $YTbSi_4N_6C:Ce^{3+}$ and $SrGa_2S_4:Eu^{2+}$. As the green phosphor, there are mentioned $Ca_2LaZr_2(AlO_4)_3:Ce^{3+}$, $Ca_2TbZr_2(AlO_4)_3:Ce^{3+}$, $Ca_2TbZr_2(AlO_4)_3:Ce^{3+}$ and $Pr^{3+}$. As the yellow or orange phosphor, there are mentioned $(Sr,Ba)_2SiO_4:Eu^{2+}$, $(Y,Gd)_3Al_5O_{12}:Ce^{3+}$ and $\alpha$-Ca—$SiAlON:Eu^{2+}$. As the yellow or orange phosphor, there are mentioned $Y_2Si_4N_6C:Ce^{3+}$, $La_3Si_6N_{11}:Ce^{3+}$ and $Y_3MgAl(AlO_4)_2(SiO_4):Ce^{3+}$. As the red phosphor, there are mentioned $Sr_2Si_5N_8:Eu^{2+}$, $CaAlSiN_3:Eu^{2+}$, $SrAlSi_4N_7:Eu^{2+}$, $CaS:Eu^{2+}$, $La_2O_2S:Eu^{3+}$ and $Y_3Mg_2(AlO_4)(SiO_4)_2:Ce^{3+}$.

Note that the phosphor for use is made of only the oxide, whereby a low-cost semiconductor light-emitting device can be realized.

As mentioned above, the rare earth aluminum garnet-type phosphor of this embodiment has the peak or maximum value of the excitation spectrum within the wavelength range of 380 nm or more to less than 470 nm. Therefore, preferably, the light-emitting device according to this embodiment includes: the solid-state light-emitting element 6 that emits the purple or blue light having the emission peak within the wavelength range of 380 nm or more to less than 470 nm; and the wavelength conversion layer 9 including the phosphor 2 of this embodiment.

Note that, as preferable combinations of the solid-state light-emitting element and the phosphor, those as follows are mentioned. For example, for the purple solid-state light-emitting element, the following combinations are preferable, which are: a combination of the blue phosphor, the green phosphor and the red phosphor; a combination of the blue green phosphor, the green phosphor and the yellow phosphor; a combination of the blue green phosphor, the green phosphor and the red phosphor; and a combination of the green phosphor and the red phosphor. Moreover, for the purple solid-state light-emitting element, a combination of the blue green phosphor, the yellow phosphor and the red phosphor, and a combination of the yellow phosphor and red phosphor are preferable. Furthermore, for the blue solid-state light-emitting element, a combination of the green phosphor and the yellow phosphor, a combination of the green phosphor and the red phosphor, a combination of the green phosphor, and a combination of the yellow phosphor and the red phosphor are preferable.

Then, preferably, the semiconductor light-emitting device is composed by using any of these combinations, or is configured to finally emit the output light that is based on these combinations. Note that the semiconductor light-emitting device of this embodiment uses the rare earth aluminum garnet-type phosphor of this embodiment as the green phosphor, the blue green phosphor or the red phosphor.

However, the phosphor of this embodiment can also be made as a phosphor that emits at least both of the green light component and the red light component. Therefore, in the semiconductor light-emitting device of this embodiment, the above-described combination of the green phosphor and the red phosphor can also be replaced by the phosphor of this embodiment. Moreover, the phosphor of this embodiment can also be used solely in place of the combination of the green phosphor and the red phosphor. Note that, in a case of solely using the phosphor of this embodiment, it becomes unnecessary to use the plurality of phosphors, and accordingly, it becomes possible to simplify a manufacturing process of the semiconductor light-emitting device.

Here, a description is made of an example of a manufacturing method of the semiconductor light-emitting device shown in FIG. 2. First, the solid-state light-emitting element 6 is fixed onto the substrate 5, on which the wiring conductors 7 are formed, by using a packaging technology. Next, the power feed electrodes 8 of the solid-state light-emitting element 6 and the wiring conductors 7 are electrically connected to each other by using a wire bonding technology and the like.

Meanwhile, the translucent resin 10 such as silicone resin and the phosphor 2 are sufficiently mixed with each other, whereby phosphor paste adjusted so as to obtain a predetermined viscosity is prepared. A weight ratio of the phosphor 2 in the phosphor paste is set at several percent to several ten percent. Thereafter, the phosphor paste is dropped onto the solid-state light-emitting element 6, and so on, whereby a light extraction surface of the solid-state light-emitting element 6 is covered with the phosphor paste, and the phosphor paste is solidified by being dried, and so on. In such a way, a semiconductor light-emitting device on which the wavelength conversion layer 9 is formed can be obtained.

In the semiconductor light-emitting device formed as described above, when the solid-state light-emitting element 6 is energized and supplied with predetermined electric power, the solid-state light-emitting element 6 emits the primary light as the short-wavelength visible light. That is to say, the solid-state light-emitting element 6 emits the purple light having the emission peak within the range of 380 nm or more to less than 420 nm, or the blue light having the emission peak within the range of 420 nm or more to less than 470 nm. By the phosphor 2, this primary light is subjected to the wavelength conversion into at least one of the blue green light, the green light and the red light with high conversion efficiency.

The primary light is irradiated onto the phosphor 2 contained in the wavelength conversion layer 9, and a part thereof is absorbed by the phosphor 2. The primary light absorbed by the phosphor 2 is subjected to the wavelength conversion into the light that has moved relatively to the long wavelength side (lower energy side). Then, the light subjected to the wavelength conversion by the phosphor 2 transmits through the translucent resin 10, and is emitted from the semiconductor light-emitting device. Meanwhile, the primary light that is not absorbed by the phosphor 2 also transmits through the translucent resin 10, and is emitted from the semiconductor light-emitting device. As a result, both of such wavelength conversion light by the phosphor 2 and the primary light that is not absorbed by the phosphor 2 are emitted from the semiconductor light-emitting device. That is to say, a light component obtained by adding and mixing of both of these with each other is outputted from the semiconductor light-emitting device.

Note that the thickness and light transmittance of the wavelength conversion layer 9, the type and mixture ratio of the phosphor 2 contained in the wavelength conversion layer 9, the wavelength of the primary light emitted by the solid-state light-emitting element, and the like can be adjusted appropriately. Therefore, the light source just needs to be designed so that illumination light such as a desired light source color and the white color can be obtained. Note that there is also a case where the primary light is entirely absorbed by the phosphor and is subjected to the wavelength conversion thereby, and in this case, the emitted light from the semiconductor light-emitting device becomes only the light subjected to the wavelength conversion by the phosphor.

Here, FIG. 3 to FIG. 6 show examples of the spectral distribution of the output light emitted by the semiconductor light-emitting device of this embodiment. As mentioned above, preferably, the semiconductor light-emitting device of this embodiment emits the purple or blue light component, which has the emission peak within the wavelength range of 380 nm or more to less than 470 nm, by the solid-state light-emitting element. Moreover, preferably, the semiconductor light-emitting device emits the green light component, which has the emission peak within the wavelength range of 535 nm or more to less than 560 nm, and particularly, 540 nm or more to less than 555 nm, by the phosphor. Therefore, in the semiconductor light-emitting device shown in FIG. 3 to FIG. 6, a purple light component 12, which has the emission peak within the wavelength range of 380 nm or more to less than 420 nm, and a blue light component 13, which has the emission peak within the wavelength range of 420 nm or more to less than 470 nm, are shown. Moreover, in FIG. 3 to FIG. 6, a green light component 14, which has the emission peak within the wavelength range of 535 nm or more to less than 560 nm, is shown.

Figure 3:
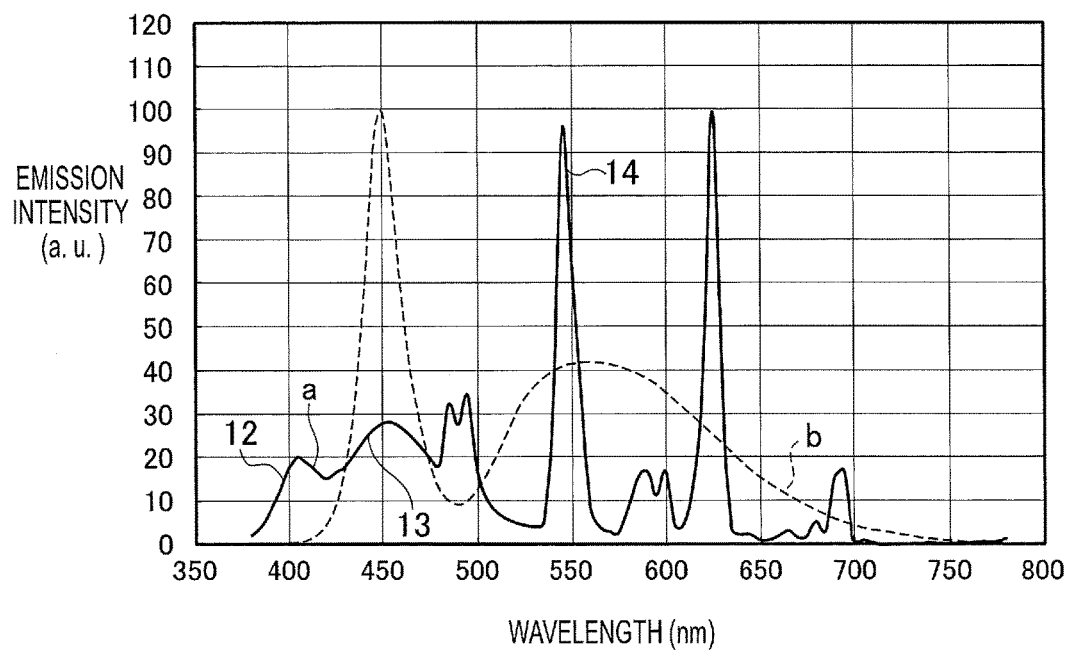
FIG. 3 is a graph showing spectral distributions of output light emitted from the semiconductor light-emitting device according to the embodiment of the present invention.
Figure 4:
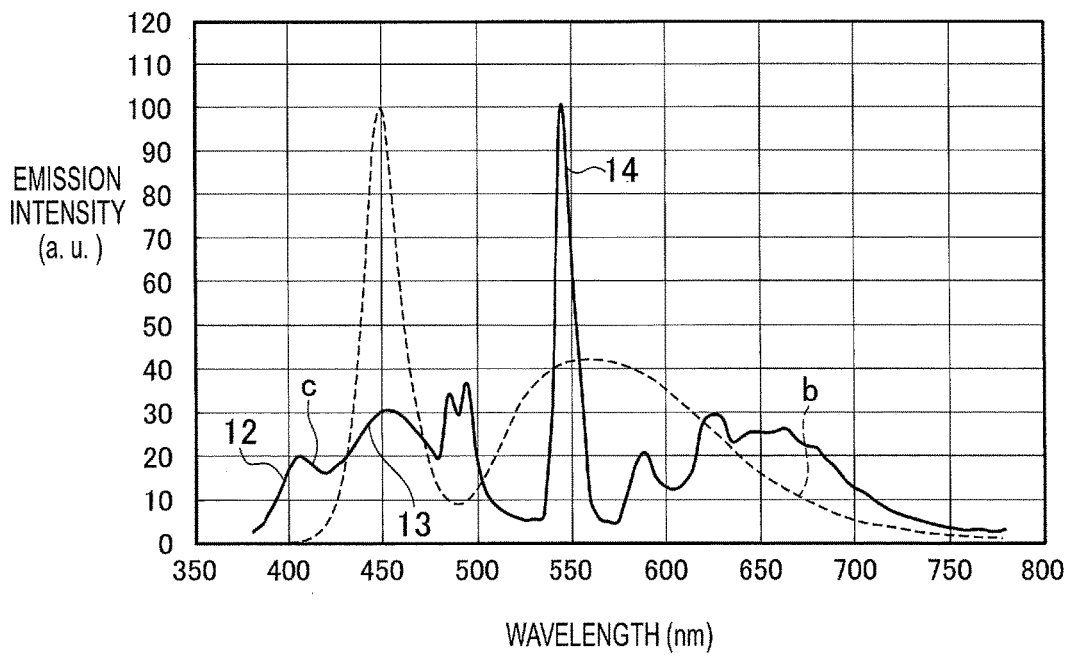
FIG. 4 is a graph showing spectral distributions of the output light emitted from the semiconductor light-emitting device according to the embodiment of the present invention.

FIG. 3 and FIG. 4 show spectral distributions in a case of emitting a three-wavelength white output light with a correlated color temperature of 6700 K, which corresponds to a daylight color. Then, in the spectral distributions, an InGaN purple LED that uses, as a light-emitting layer, the InGaN-based compound emitting the purple light is used as the solid-state light-emitting element. Note that a peak wavelength of the InGaN purple LED is 405 nm. Moreover, as such phosphors, the rare earth aluminum garnet-type phosphor, which emits the green light by $Tb^{3+}$, and the red phosphor are used. Note that FIG. 3 and FIG. 4 show a case of using the $Eu^{3+}$-activated phosphor as the red phosphor and a case of using the $Eu^{2+}$-activated phosphor as the red phosphor, respectively.

A solid line a shown in FIG. 3 shows a spectral distribution in a case of combining the InGaN purple LED, the $Eu^{2+}$-activated phosphor that emits the blue light component, the phosphor of this embodiment, which emits the green color component, and the $Eu^{3+}$-activated phosphor ($La_2O_2S:Eu^{3+}$), which emits the red color component, with one another. Note that, as the $Eu^{2+}$-activated phosphor that emits the blue light component, $BaMgAl_{10}O_{17}:Eu^{2+}$ is used, which has a emission peak in a vicinity of 450 nm. Moreover, as the phosphor of this embodiment, $Ca_2TbZr_2(AlO_4)_3:Ce^{3+}$ is used, which has a main emission peak in a vicinity of 545 nm. Furthermore, as the $Eu^{3+}$-activated phosphor that emits the red light component, $La_2O_2S:Eu^{3+}$ is used, which has a emission peak in a vicinity of 625 nm.

Moreover, a broken line b shown in FIG. 3 shows a spectral distribution in a reference example in a case of emitting pseudo white output light with a correlated color temperature of 6700 K. Then, in this spectral distribution, an InGaN blue LED (output peak wavelength: 450 nm) is used as the solid-state light-emitting element. Furthermore, a YAG:Ce-based phosphor that emits a yellow green light component having a emission peak in a vicinity of 555 nm is used as the phosphor.

In the white output light shown as the solid line a in FIG. 3, a general color rendering index Ra thereof is 87, and meanwhile, in the pseudo white output light in the reference example, which is shown as the broken line b, Ra thereof is 77. Therefore, in the white output light shown as the solid line a in FIG. 3, a numeric value of Ra thereof is sufficiently high, and the white output light can be used as illumination light similar to the natural light. Note that the spectral distribution of the white output light shown as the solid line a in FIG. 3 resembles the spectral distribution emitted by the three-wavelength fluorescent lamp having a high track record as a light source that strikes a balance between high rendering properties and high efficiency. Therefore, in accordance with this embodiment, illumination light that bears comparison with light of the three-wavelength fluorescent lamp can be obtained.

Meanwhile, a solid line c in FIG. 4 shows a spectral distribution in a case of combining the InGaN purple LED, the $Eu^{2+}$-activated phosphor that emits the blue light component, the phosphor of this embodiment, which emits the green color component, and the $Eu^{2+}$-activated phosphor, which emits the red color component, with one another. Note that, as the $Eu^{2+}$-activated phosphor that emits the blue light component, $BaMgAl_{10}O_{17}:Eu^{2+}$ is used, which has the emission peak in the vicinity of 450 nm. Moreover, as the phosphor of this embodiment, $Ca_2TbZr_2(AlO_4)_3:Ce^{3+}$ is used, which has the main emission peak in the vicinity of 545 nm. Furthermore, as the $Eu^{2+}$-activated phosphor that emits the red light component, $CaAlSiN_3:Eu^{2+}$ is used, which has a emission peak in a vicinity of 650 nm. Note that, for reference, the spectral distribution (broken line b) of the pseudo white output light with a correlated color temperature of 6700 K is also shown in FIG. 4.

In the white output light shown as the solid line c in FIG. 4, a general color rendering index Ra thereof is 85, and meanwhile, in the pseudo white output light in the reference example, which is shown as the broken line b, Ra thereof is 77. Therefore, in the white output light shown as the solid line c in FIG. 4, a numeric value of Ra thereof is sufficiently high, and the white output light can be used as illumination light similar to the natural light.

Figure 5:
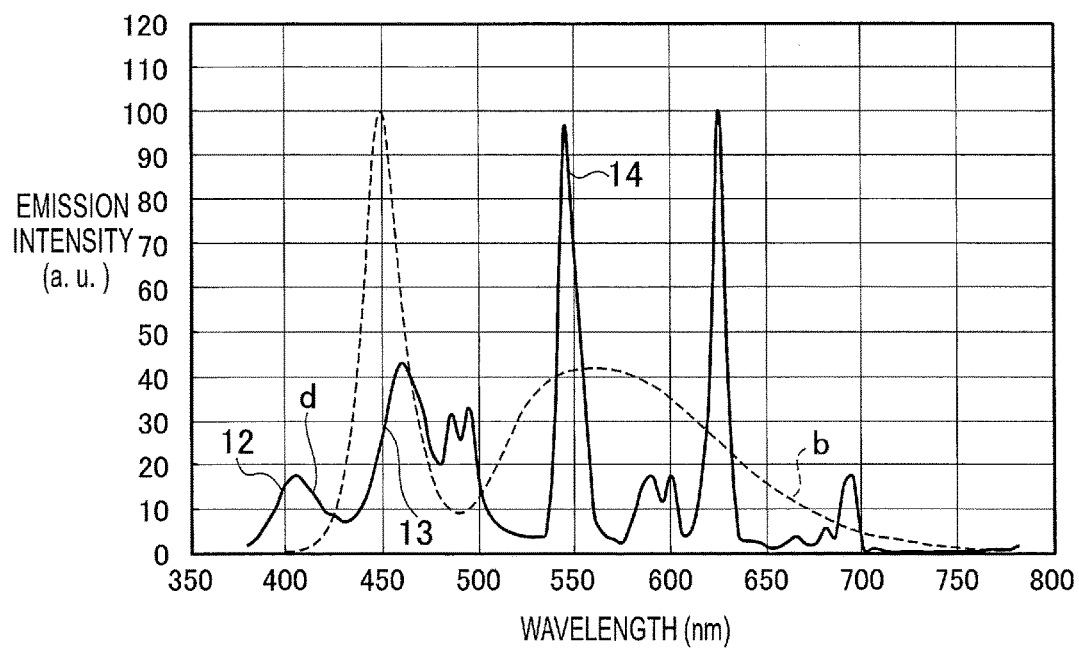
FIG. 5 is a graph showing spectral distributions of the output light emitted from the semiconductor light-emitting device according to the embodiment of the present invention.
Figure 6:
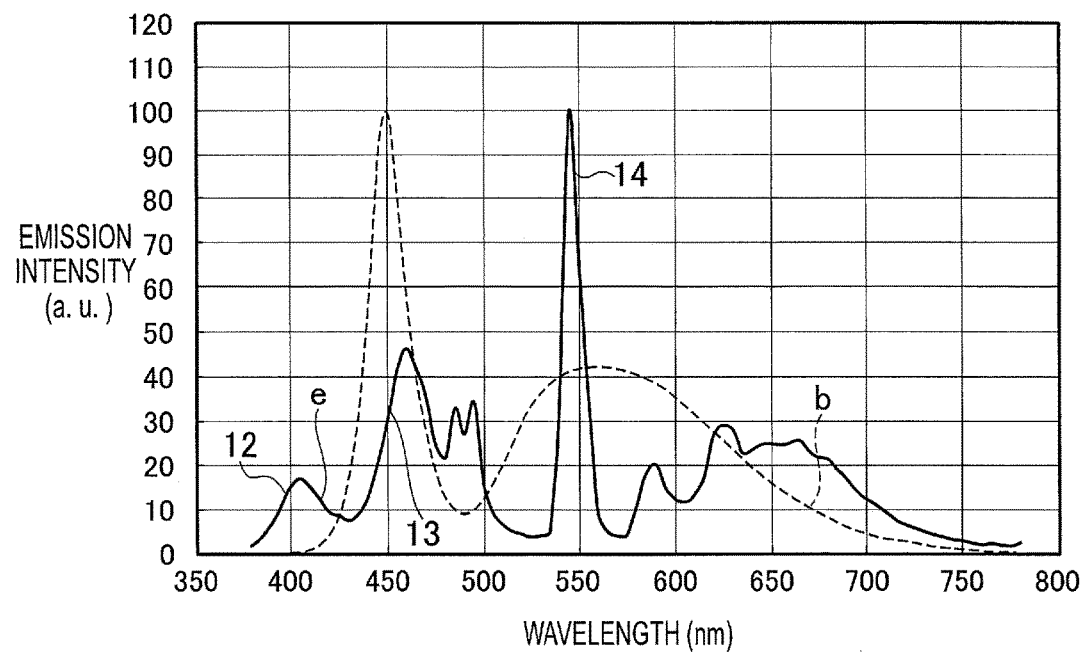
FIG. 6 is a graph showing spectral distributions of the output light emitted from the semiconductor light-emitting device according to the embodiment of the present invention.

Each of semiconductor light-emitting devices in FIG. 5 and FIG. 6 includes two LEDs, which are: the InGaN purple LED that uses, as a light-emitting layer, the InGaN-based compound emitting the purple light; and the InGaN blue LED that uses, as a light-emitting layer, the InGaN-based compound emitting the blue light, as the solid-state light-emitting elements. Here, the output peak wavelength of the InGaN purple LED is 405 nm, and the output peak wavelength of the InGaN blue LED is 450 nm. Then, FIG. 5 and FIG. 6 show spectral distributions in the case of emitting the three-wavelength white output light with a correlated color temperature of 6700 K, which corresponds to the daylight color, by using the phosphor of this embodiment, which emits the green light by $Tb^{3+}$, and using the red phosphor. Note that FIG. 5 and FIG. 6 show a case of using the $Eu^{3+}$-activated phosphor as the red phosphor and a case of using the $Eu^{2+}$-activated phosphor as the red phosphor, respectively.

A solid line d shown in FIG. 5 shows a spectral distribution in a case of combining the InGaN purple LED, the InGaN blue LED, the phosphor of this embodiment, which emits the green color component, and the $Eu^{3+}$-activated phosphor, which emits the red color component, with one another. Note that, as the phosphor of this embodiment, $Ca_2TbZr_2(AlO_4)_3:Ce^{3+}$ is used, which has a emission peak in the vicinity of 545 nm. Moreover, as the $Eu^{3+}$-activated phosphor, which emits the red color component, $La_2O_2S:Eu^{3+}$ is used, which has a emission peak in the vicinity of 625 nm. Note that, for reference, the spectral distribution (broken line b) of the pseudo white output light with a correlated color temperature of 6700 K is also shown in FIG. 5.

In the white output light shown as the solid line d in FIG. 5, a general color rendering index Ra thereof is 86. Therefore, a numeric value of Ra thereof is sufficiently high in comparison with that of the pseudo white output light in the reference example, which is shown as the broken line b, and accordingly, the white output light shown as the solid line d in FIG. 5 can be used as the illumination light similar to the natural light. Note that the spectral distribution of the white output light shown as the solid line d in FIG. 5 also resembles the spectral distribution emitted by the three-wavelength fluorescent lamp. Therefore, in accordance with this embodiment, the illumination light that bears comparison with light of the three-wavelength fluorescent lamp can be obtained.

Meanwhile, a solid line e in FIG. 6 shows a spectral distribution in a case of combining the InGaN purple LED, the InGaN blue LED, the phosphor of this embodiment, which emits the green light component, and the $Eu^{2+}$-activated phosphor, which emits the red color component, with one another. Note that, as the phosphor of this embodiment, $Ca_2TbZr_2(AlO_4)_3:Ce^{3+}$ is used, which has the main emission peak in the vicinity of 545 nm. Moreover, as the $Eu^{2+}$-activated phosphor that emits the red light component, $CaAlSiN_3:Eu^{2+}$ is used, which has a emission peak in the vicinity of 650 nm. Note that, for reference, a spectral distribution (broken line b) of the pseudo white output light with a correlated color temperature of 6700 K is also shown in FIG. 6.

In the white output light shown as the solid line e in FIG. 6, a general color rendering index Ra thereof is 85. Therefore, a numeric value of Ra thereof is sufficiently high in comparison with that of the pseudo white output light in the reference example, which is shown as the broken line b, and accordingly, the white output light shown as the solid line e in FIG. 6 can be used as the illumination light similar to the natural light.

Note that the white output light of the semiconductor light-emitting device according to this embodiment, which is shown by the solid line in each of FIG. 3 to FIG. 6, takes a three-wavelength shape, which individually has peaks in the wavelength range of the blue color in the vicinity of 450 nm, the wavelength range of the green color in the vicinity of 540 nm, and the wavelength range of the red color in the vicinity of 620 nm or 650 nm. Therefore, by using intense light components of red, green and blue, the light-emitting device of this embodiment can be used as a light source for multi-color display, which has a wide color range and a high light output.

Moreover, the white output light shown by each of the solid lines a and d in FIG. 3 and FIG. 5 has narrow light components in the spectral distribution, and accordingly, an advantage in terms of enhancing the output is brought. That is to say, the white output light shown by each of the solid lines a and d in FIG. 3 and FIG. 5 has a luminous flux enhancement effect of approximately 25% with respect to the while output light shown by each of the solid lines c and e in FIG. 4 and FIG. 6. Note that this luminous flux enhancement effect can be calculated by using a calculating expression, which considers the visual sensitivity, for the spectral distribution in each of FIG. 3 to FIG. 6, which is adjusted so that a total photon number therein can become constant.

As described above, the light-emitting device of this embodiment can be made as a light-emitting device with much higher efficiency by using at least the rare earth aluminum garnet-type phosphor of this embodiment and the $Eu^{3+}$-activated phosphor.

Note that, as the $Eu^{2+}$-activated phosphor, which has the emission peak in the vicinity of 650 nm and is used for the semiconductor light-emitting devices according to FIG. 4 and FIG. 6, $CaAlSiN_3:Eu^{2+}$ can be used as mentioned above. Moreover, a nitride silicate-based phosphor ($Sr_2Si_5N_8:Eu^{2+}$ and the like) activated by $Eu^{2+}$, a nitrido alumino silicate-based phosphor (($Sr,Ca)AlSiN_3:Eu^{2+}$, $SrAlSi_4N_7:Eu^{2+}$ and the like) can also be used.

Moreover, as the $Eu^{3+}$-activated red phosphor for use in the semiconductor light-emitting devices according to FIG. 3 and FIG. 5, $La_2O_2S:Eu^{3+}$ can be used. Moreover, the phosphor of this embodiment, which emits the red fluorescent component of $Eu^{3+}$, and an $Eu^{3+}$-activated red phosphor other than this can also be used.

Here, as previously mentioned, the phosphor of this embodiment can be made as one that emits the fluorescent components of both of $Tb^{3+}$ and $Eu^{3+}$. Therefore, the combination of the phosphor, which emits the green light by $Tb^{3+}$, and the $Eu^{3+}$-activated phosphor, the combination being used for the semiconductor light-emitting devices according to FIG. 3 and FIG. 5, can also be replaced by the phosphor of this embodiment, which emits the fluorescent components of both of $Tb^{3+}$ and $Eu^{3+}$.

As described above, the light-emitting device of this embodiment uses the rare earth aluminum garnet-type phosphor of this embodiment, and particularly, the aluminum garnet-type phosphor that emits the fluorescence by at least either one of $Tb^{3+}$ and $Eu^{3+}$. However, means for obtaining the spectral distributions shown in FIG. 3 to FIG. 6 is not particularly limited.

That is to say, the spectral distributions shown in FIG. 3 and FIG. 4 can be obtained by a semiconductor light-emitting device configured to combine the purple LED and a fluorescent membrane with each other, and to allow the fluorescent membrane to contain a plurality of the phosphors. Note that, as such phosphors, for example, there can be used: one in which the blue phosphor, the green phosphor and the red phosphor are combined with one another; and one in which the blue phosphor and the phosphor emitting the green fluorescent component and the red fluorescent component are combined with each other. Moreover, the spectral distributions shown in FIG. 3 and FIG. 4 can be obtained by a semiconductor light-emitting device composed of the purple LED and fluorescent membranes, in which phosphors contained in the fluorescent membranes are different from each other. In the former case, a semiconductor light-emitting device simple in terms of the configuration is obtained, and in the latter case, a semiconductor light-emitting device easy to control the color tone is obtained.

Moreover, the spectral distributions shown in FIG. 5 and FIG. 6 can be obtained by a semiconductor light-emitting device configured to combine the purple LED, the blue LED and the fluorescent membrane with one another, and further, to allow the purple LED and the blue LED to simultaneously excite the phosphor in the fluorescent membrane. Note that, as the fluorescent membrane, for example, there can be used: one in which the green phosphor and the red phosphor are combined with each other; and the phosphor that emits the green fluorescent component and the red fluorescent component. Moreover, the spectral distributions shown in FIG. 5 and FIG. 6 can be obtained by preparing in advance a semiconductor light-emitting device composed of the purple LED and the fluorescent membrane and a semiconductor light-emitting device composed of the blue LED and the fluorescent membrane, and by combining these semiconductor light-emitting devices with each other. In the former case, a semiconductor light-emitting device easy to manufacture is obtained, and in the latter case, a semiconductor light-emitting device easy to control the color tone is obtained.

As described above, the semiconductor light-emitting device combines the solid-state light-emitting element, which emits the purple and/or blue light, and the phosphor, which absorbs the light and emits the emission line-like green light component and/or red light component, with each other. Therefore, the semiconductor light-emitting device emits at least either of the emission line-like green light component, which has the emission peak within the wavelength range of 535 nm or more to less than 560 nm, and the emission line-like red light component, which has the emission peak within the wavelength range of 600 nm or more to less than 628 nm.

Here, the emission line-like green light component has high visual sensitivity. Then, the semiconductor light-emitting device of this embodiment can emit the light with a high luminous flux and the green light component with a high output, and accordingly, urges brightness enhancement of a green pixel in a display device.

Meanwhile, in the above-described emission line-like red light component, spectra thereof are concentrated in a wavelength range in which the visual sensitivity is relatively high among the red light. Then, the semiconductor light-emitting device of this embodiment can emit the light with a high luminous flux and the red light component with a high output, and accordingly, urges brightness enhancement of a red pixel in the display device. Moreover, the semiconductor light-emitting device of this embodiment urges enhancement of a luminous flux in an illumination device that emits the warm-colored light.

Note that the semiconductor light-emitting device of this embodiment is widely usable for the illumination light source, the backlight of the liquid crystal display, the light source for the display device, and the like. That is to say, as mentioned above, unlike the green phosphor and the red phosphor, which have been heretofore used exclusively for the solid-state illumination, the phosphor of this embodiment is capable of emitting light having the emission line-like green light component and red light component.

Therefore, in a case of using the phosphor for the illumination light source and the like, an illumination light source, which has high rendering properties and high efficiency, and a display device, which is capable of wide color range-display of a high luminance screen, can be provided.

The illumination light source as described above can be composed by combining the semiconductor light-emitting device of this embodiment, a lighting circuit that actuates the semiconductor light-emitting device, and a connection component such as a base to an illumination fixture with one another. Moreover, if such illumination fixtures are combined with one another according to needs, then an illumination device and an illumination system will also be configured.

The display device can be composed by combining such semiconductor light-emitting devices, which are arranged in a matrix shape, and a signal circuit, which switches ON/OFF these semiconductor light-emitting devices, with each other. Moreover, as the display device, a liquid crystal panel added with an LED backlight function can be mentioned. Specifically, the display device arranges the semiconductor light-emitting devices of this embodiment in a line shape or the matrix shape, and uses the same as the backlight. Then, the display device is composed by combining the backlight, a lighting circuit, which lights the backlight, or a control circuit, which controls ON/OFF of the backlight, and the liquid crystal panel with one another.

<Light Source Device>

Figure 7:
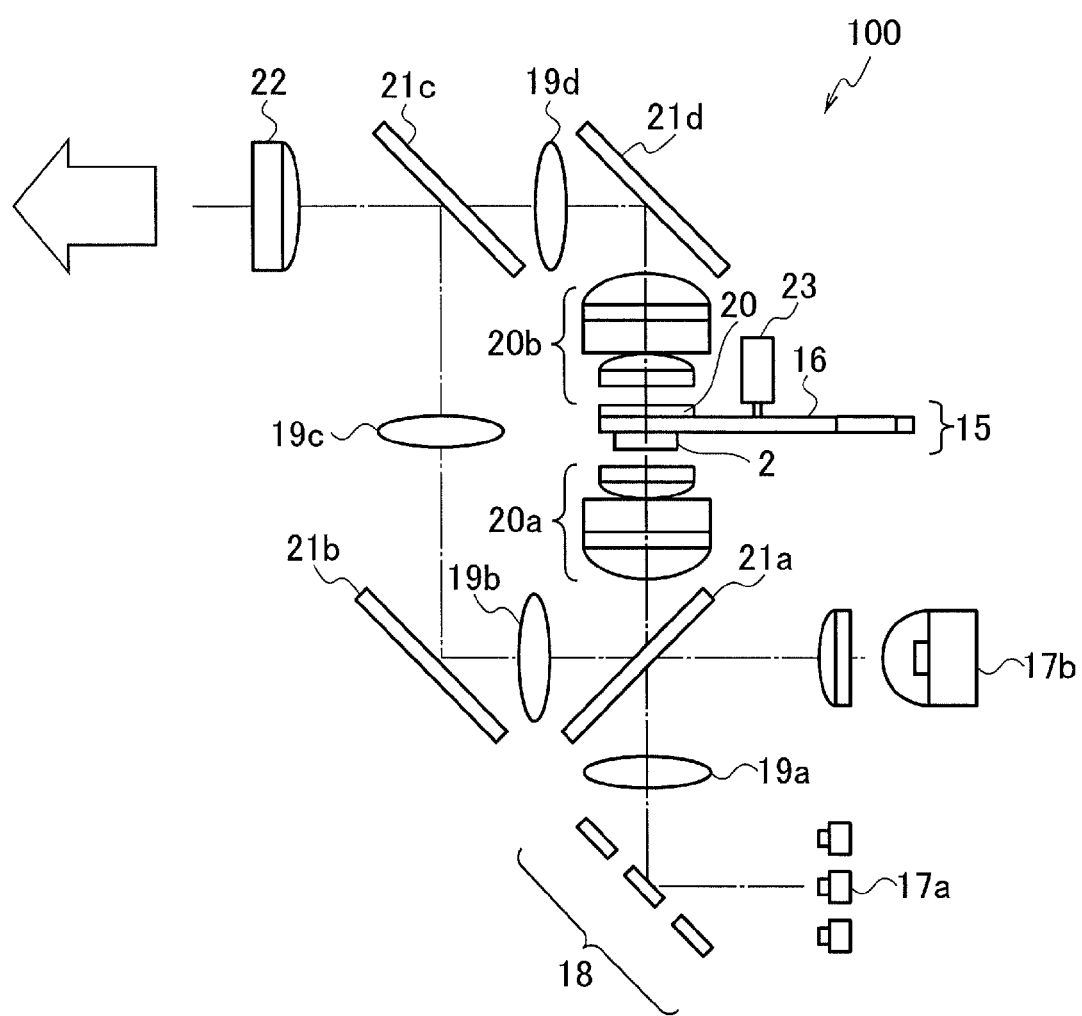
FIG. 7 is a view showing a configuration of a light source device according to the embodiment of the present invention.

FIG. 7 is a view schematically showing a light source device 100 as a specific example of the light-emitting device according to this embodiment. In FIG. 7, a fluorescent plate 15 is a fluorescent plate using the phosphor 2 of this embodiment. That is to say, the fluorescent plate 15 is composed by forming a layer of the phosphor 2 on one surface of a base material 16. Moreover, first light sources 17a are light sources for exciting the phosphor, and for example, are such solid-state light-emitting elements 6 which have a emission peak within the range of 380 nm or more to less than 470 nm. Then, as shown in FIG. 7, the light source device 100 irradiates pieces of short-wavelength visible light, which is emitted by the first light sources 17a, onto the phosphor 2, which is formed on the fluorescent plate 15, directly or indirectly. Then, the light source device 100 outputs green or red light components subjected to the wavelength conversion by the phosphor 2.

In FIG. 7, a plurality of the first light sources 17a are provided. Then, each piece of the short-wavelength visible light emitted by the first light sources 17a is reflected by each of reflecting mirrors 18, condensed by a first lens 19a, and is thereafter irradiated onto the phosphor 2 formed on the one surface of the fluorescent plate 15. Moreover, on a surface of the fluorescent plate 15, on which the phosphor 2 is not formed, a reflecting surface 20 is provided. By the reflecting surface 20, the light component (for example, the emission line-like green or red light component) emitted by the phosphor 2 is reflected in a direction reverse to a direction where the short-wavelength visible light emitted by the first light sources 17a is irradiated.

In a case of the light source device 100, the light component, which is emitted by the phosphor 2 and reflected by the reflecting surface 20, is condensed by first condensing lenses 20a. Thereafter, the light component is repeatedly subjected to optical axis conversion and light condensation by a first optical axis conversion mirror 21a, a second lens 19b, a second optical axis conversion mirror 21b, a third lens 19c and a third optical axis conversion mirror 21c. Then, the light component is made incident onto an incident lens 22, and is thereafter emitted from the light source device 100.

With regard to the phosphor 2, preferably, the purple light emitted by each of the first light sources 17a is sufficiently absorbed thereto by thickening a thickness of the membrane thereof. In such a way, a green or red light component with good color purity is emitted from the light source device 100.

Meanwhile, in order to realize such a light source device 100 of the multi-color display, the blue light component and the red or green light component just need to be emitted through the incident lens 22. Specifically, the blue light component can be emitted from the light source device 100 in such a manner as follows. First, the first light sources 17a are divided into the purple LD and the blue LD, and thereafter, the blue light component emitted by the blue LD is allowed to transmit through the fluorescent plate 15. Then, the blue light component just needs to be subjected to the light condensation and the optical axis conversion by second condensing lenses 20b, a fourth optical axis conversion mirror 21d and a fourth lens 19d, and thereafter, just needs to be emitted from the incident lens 22.

In the light source device 100 as described above, preferably, the fluorescent plate 15 is made rotatable by using a motor 23 and the like. Then, preferably, the fluorescent plate 15 is divided into a region where the short-wavelength visible light emitted by the first light source 17a is irradiated onto the phosphor 2 and a region where the short-wavelength visible light transmits through the fluorescent plate without being irradiated onto the phosphor 2. Furthermore, the first light sources 17a divided into the purple LD and the blue LD are controlled to alternately emit the purple light and the blue light. Then, such alternative pieces of the light and the two regions are synchronized with each other, and the fluorescent plate 15 is rotated so that the purple light can be irradiated onto the phosphor 2, and that the blue light can transmit through the fluorescent plate 15. In such a way, the blue light and the green light or the red light, which is generated by the phosphor 2, can be emitted from the light source device 100.

Besides the above, the red light component can be emitted from the light source device 100 in such a manner as follows. First, as shown in FIG. 7, a second light source 17b such as a red LED that emits the red light is provided. Next, the red light component emitted by the second light source 17b is repeatedly subjected to the light condensation and the optical axis conversion by the second lens 19b, the second optical axis conversion mirror 21b, the third lens 19c and the third optical axis conversion mirror 21c. Then, the red light component is emitted from the light source device 100.

As described above, the outputs of the first light sources 17a, the output of the second light source 17b and the rotation speed of the fluorescent plate 15 are controlled, whereby the light source device for the multi-color display is realized, in which the red, green and blue light components serving as the three primary colors of the light are individually controlled and emitted.

The light source device as described above is usable for a projector-type display device (an LED projector, a laser projector and the like). That is to say, the light emitted from the light source device 100 is condensed onto a micromirror display element (digital micromirror device: DMD, not shown), a liquid crystal panel and the like. Then, the optically modulated light is projected onto a screen (not shown), whereby a display image synchronized with a modulation signal can be obtained. In the display device as described above, a ratio of the green light component or the red light component, which has large visual sensitivity, is high, and accordingly, the display device becomes capable of displaying an image, which is bright and excellent in visibility.

Note that the light source device of this embodiment is not limited to the light source device of FIG. 7. Specifically, the first light sources 17a can also be composed of LEDs which emit the short-wavelength visible light, and the second light source 17b can also be composed as a red LD.

Moreover, the fluorescent plate 15 is divided into the region where the phosphor is provided and the region where the short-wavelength visible light transmits therethrough without being irradiated onto the phosphor, and the fluorescent plate 15 is made rotatable. Then, the first light sources 17a are made as LDs which emit the short-wavelength visible light. In such a way, the short-wavelength visible light is irradiated onto the phosphor, whereby the green light and the red light are radiated, and further, the blue light is radiated from the blue LD, and accordingly, it becomes possible to emit the individually controlled red, green and blue light components.

Moreover, the first light sources 17a may be made as purple LDs, and on the fluorescent plate 15, regions including the blue phosphor, the red phosphor and the red phosphor may be provided. In such a way, the purple light emitted by the purple LDs is irradiated onto the blue phosphor, the green phosphor and the red phosphor, whereby it becomes possible to radiate the blue light, the green light and the red light.

As described above, the light-emitting device of this embodiment has good characteristics in terms of the visual sensitivity and visibility of the green or red light component, and accordingly, can be widely used for those other than the above-mentioned semiconductor light-emitting device and light source device.

EXAMPLES

A description is made below in more detail of examples and comparative examples of the present invention; however, the present invention is not limited to these examples.

By using a preparation method using a solid phase reaction, rare earth aluminum garnet-type phosphors of the examples and the comparative examples were synthesized, and characteristics thereof were evaluated. Note that, in the examples here, powders of the following compounds were used as raw materials.

Yttrium oxide ($Y_2O_3$): purity 3N, produced by Shin-Etsu Chemical Co. Ltd.
Cerium oxide ($CeO_2$): purity 4N, produced by Shin-Etsu Chemical Co. Ltd.
Europium oxide ($Eu_2O_3$): purity 3N, produced by Shin-Etsu Chemical Co. Ltd.
Terbium oxide ($Tb_4O_7$): purity 4N, produced by Shin-Etsu Chemical Co. Ltd.
Aluminum oxide ($\theta$-$Al_2O_3$): purity 4N5, produced by Sumitomo Chemical Co. Ltd.
Calcium carbonate ($CaCO_3$): purity 2N5, produced by Kanto Chemical Co. Inc.
Zirconium oxide ($ZrO_2$): purity 3N, produced by Kanto Chemical Co. Inc.
Hafnium oxide ($HfO_2$): purity 98.5%, produced by Daiichi Kigenso Kagaku Kogyo Co. Ltd.
For the purpose of enhancing reactivity between the raw materials, AKP-G008 produced by Sumitomo Chemical Co. Ltd. was used as the above-described aluminum oxide.

Moreover, in the examples, powders of the following compounds were used as a reaction accelerator.
Aluminum fluoride ($AlF_3$): purity 3N, produced by Kojundo Chemical Laboratory Co., Ltd.
Potassium carbonate ($K_2CO_3$): purity 2N5, produced by Kanto Chemical Co. Inc.

Example 1, Example 2

First, the respective raw materials and the reaction accelerator were weighed in ratios shown in Table 1. Next, by using a ball mill, these raw materials and reaction accelerator were sufficiently wet-mixed together with an appropriate amount of pure water. Then, the raw materials thus mixed were moved to a container, and were dried overnight at 120° C. by using a dryer. The mixed raw materials thus dried were milled by a mortar and a pestle, and a baking target raw material was obtained. Thereafter, the baking target raw material was moved to an alumina crucible added with a lid, and was baked in the atmosphere of 1600° C. for 4 hours by using a box-type electric furnace. In such a way, compounds of Examples 1 and 2 were prepared.

As a comparative example, publicly known YAG ($Y_3Al_2(AlO_4)_3$) was prepared in a similar way to Examples 1 and 2.

TABLE 1

|  | $CaCO_3$ (g) | $Tb_4O_7$ (g) | $Y_2O_3$ (g) | $ZrO_2$ (g) | $HfO_2$ (g) | $Al_2O_3$ (g) | $AlF_3$ (g) | $K_2CO_3$ (g) |
|---|---|---|---|---|---|---|---|---|
| Example 1 | 10.009 | 9.346 | — | 12.322 | — | 8.019 | 0.063 | 0.035 |
| Example 2 | 10.009 | 9.346 | — | — | 21.049 | 8.019 | 0.063 | 0.035 |
| Comparative example | — | — | 17.038 | — | — | 13.365 | 0.063 | 0.035 |

Figure 8:
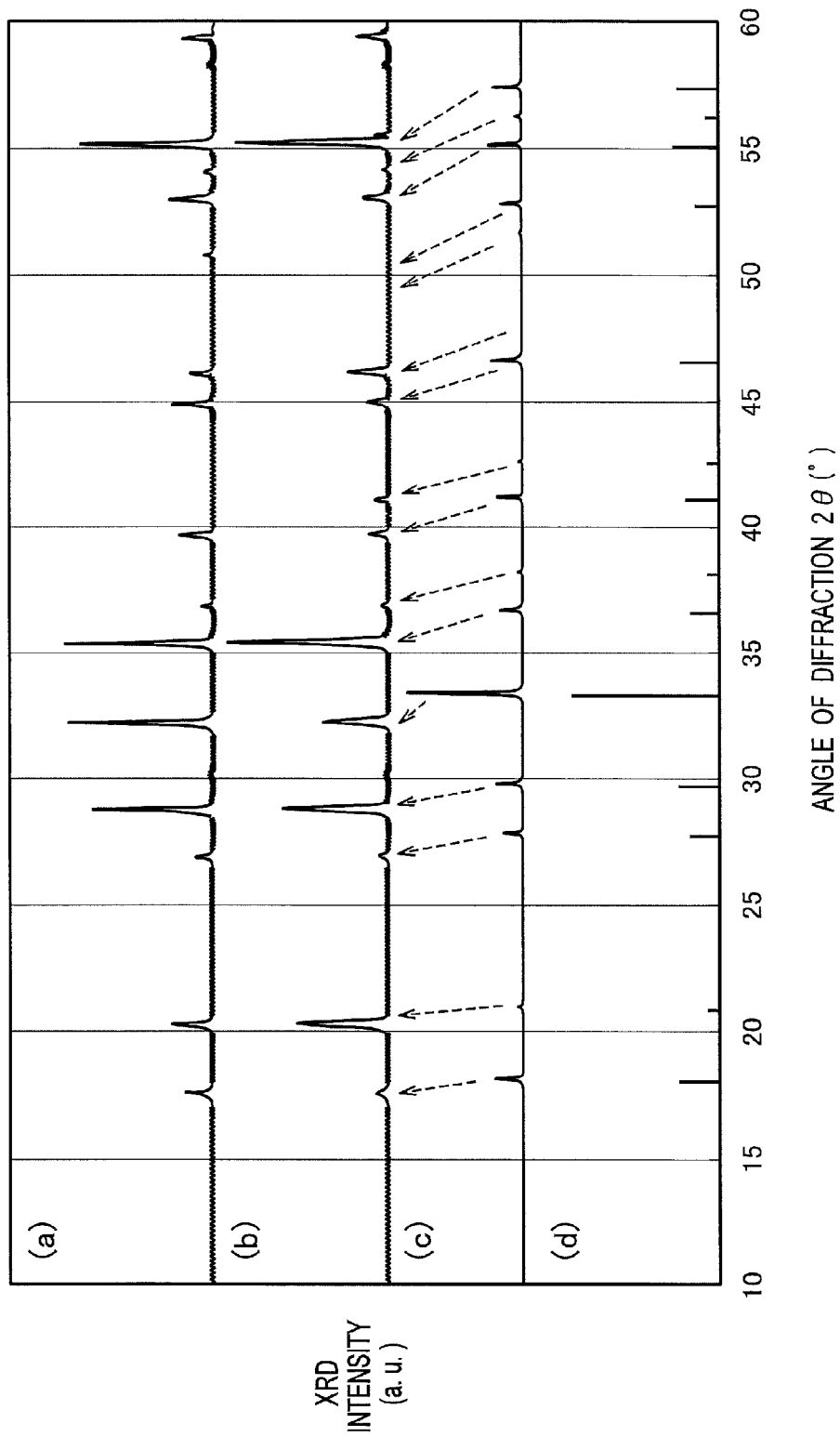
FIG. 8 is a graph showing XRD patterns of compounds in Examples 1 and 2.

Next, crystal structure analysis was performed for the compounds of Examples 1 and 2 and for YAG. FIG. 8 shows X-ray diffraction (XRD) patterns of the compounds of Examples 1 and 2 and YAG as Comparative example. Note that the XRD patterns were evaluated by an X-ray diffraction device (product name: MultiFlex, made by Rigaku Corporation).

In FIG. 8, (a) indicates the XRD pattern of Example 1, and (b) indicates the XRD pattern of Example 2. Moreover, (c) indicates the XRD pattern of Comparative example, and (d) indicates the pattern of $Al_5Y_3O_{12}$ (PDF No. 33-0040), which is registered on PDF (Power Diffraction Files).

From FIG. 8, when (a) and (b), and (c) and (d) are compared with each other, the XRD patterns of Examples 1 and 2 coincide with the XRD pattern of YAG taken as Comparative example and the pattern of $Al_5Y_3O_{12}$ in terms of shape feature. That is to say, though the XRD patterns of the compounds in Examples 1 and 2 are different from those of Comparative example and $Al_5Y_3O_{12}$ in intensity ratio of diffraction peaks, the number of diffraction peaks is equal therebetween. Moreover, the XRD patterns of Examples 1 and 2 are formed into a shape in which the respective diffraction peaks in the XRD patterns of Comparative example and $Al_5Y_3O_{12}$ move to a low angle side as a whole. Note that, in FIG. 8, a correspondence relationship between the diffraction peaks is shown by arrows.

Such coincidence of the XRD patterns as described above indicates that the compounds of Examples 1 and 2 are compounds having the same garnet structure as $Y_3Al_2(AlO_4)_3$. Then, the coincidence indicates that the compound of Example 1 is a compound represented by $Ca_2TbZr_2(AlO_4)_3$, and that the compound of Example 2 is a compound represented by $Ca_2TbHf_2(AlO_4)_3$.

Note that, when the compounds of Example 1 and Example 2 were irradiated with an ultraviolet ray (wavelength: 365 nm), bright green fluorescence was visually observed in both thereof.

Moreover, excitation characteristics and emission characteristics of the compound of Example 1 were evaluated by using a fluorescence spectrophotometer (product name: FP-6500, made by JASCO Corporation) and an instantaneous multi-photometer system (QE-1100, made by Otsuka Electronics Co., Ltd.) in combination. Note that, for the purpose of enhancing measurement accuracy, the instantaneous multi-photometer system was used for measuring an emission spectrum (24a'), and the fluorescence spectrophotometer was used for measuring an excitation spectrum (25a'). Then, an excitation wavelength at a time of measuring the emission spectrum was set at 250 nm, and a monitoring wavelength at a time of measuring the excitation spectrum was set at a emission peak wavelength.

Figure 9:
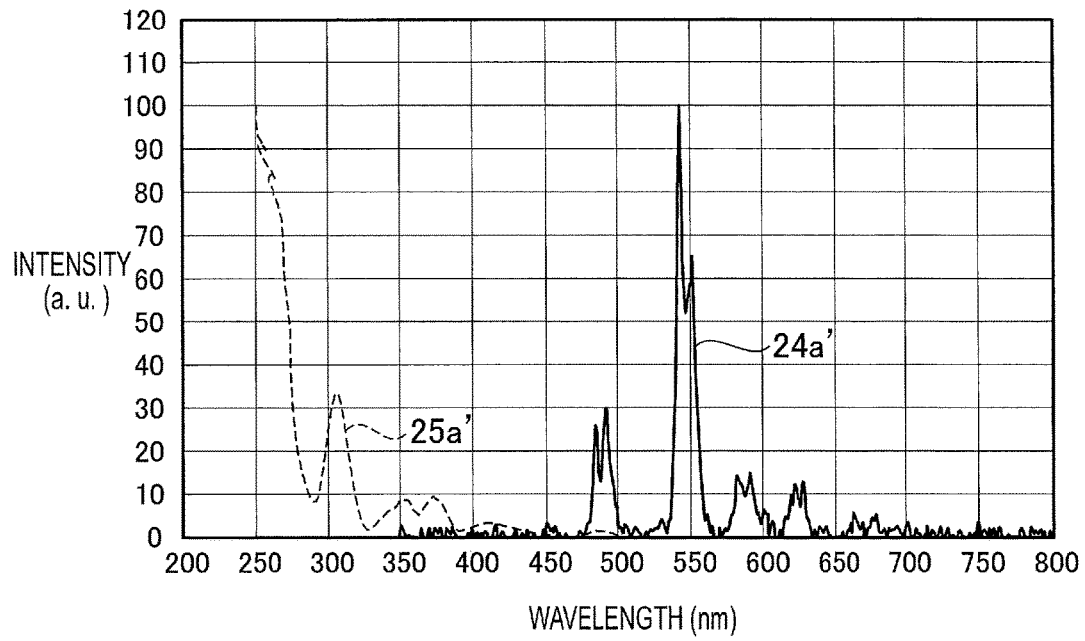
FIG. 9 is a graph showing an excitation spectrum and emission spectrum of a phosphor in Example 1.

FIG. 9 shows the excitation spectrum 25a' and emission spectrum 24a' of the compound ($Ca_2TbZr_2(AlO_4)_3$) of Example 1. From FIG. 9, it was revealed that the compound of Example 1 was excited by light in a vicinity of 250 nm. Moreover, it is also revealed that the compound of Example 1 is a green phosphor that emits light, which has a main bright line in a vicinity of 550 nm and sub-bright lines in a vicinity of 480 nm, a vicinity of 590 nm and a vicinity of 620 nm, and is derived from the electron energy transition of $Tb^{3+}$. Note that, in FIG. 9, the emission spectrum and the excitation spectrum are shown while maximum intensities of both thereof are being taken as 100. Moreover, as a matter of convenience, an excitation spectrum and emission spectrum of the compound ($Ca_2TbHf_2(AlO_4)_3$) of Example 2 are omitted; however, the compound of Example 2 exhibited spectra similar to those of the compound of Example 1.

Example 3, Example 4

First, the respective raw materials and the reaction accelerator were weighed in ratios shown in Table 2. Next, these raw materials and reaction accelerator were mixed with one another and baked in a similar way to Example 1 and Example 2, whereby compounds of Example 3 and Example 4 were prepared.

TABLE 2

|  | CaCO$_3$ (g) | Tb$_4$O$_7$ (g) | CeO$_2$ (g) | ZrO$_2$ (g) | HfO$_2$ (g) | Al$_2$O$_3$ (g) | AlF$_3$ (g) | K$_2$CO$_3$ (g) |
|---|---|---|---|---|---|---|---|---|
| Example 3 | 10.009 | 9.159 | 0.172 | 12.322 | — | 8.019 | 0.063 | 0.035 |
| Example 4 | 10.009 | 9.159 | 0.172 | — | 21.049 | 8.019 | 0.063 | 0.035 |

Next, in a similar way to Example 1 and Example 2, the crystal structure analysis was performed for the compounds of Examples 3 and 4. As a result, the compounds of Examples 3 and 4 exhibited XRD patterns similar to those of Examples 1 and 2. Therefore, it was revealed that the compound of Example 3 was a compound represented by Ca$_2$(Tb$_{0.98}$Ce$_{0.02}$)Zr$_2$(AlO$_4$)$_3$, and it was revealed that the compound of Example 4 was a compound represented by Ca$_2$(Tb$_{0.98}$Ce$_{0.02}$)Hf$_2$(AlO$_4$)$_3$.

Figure 10:
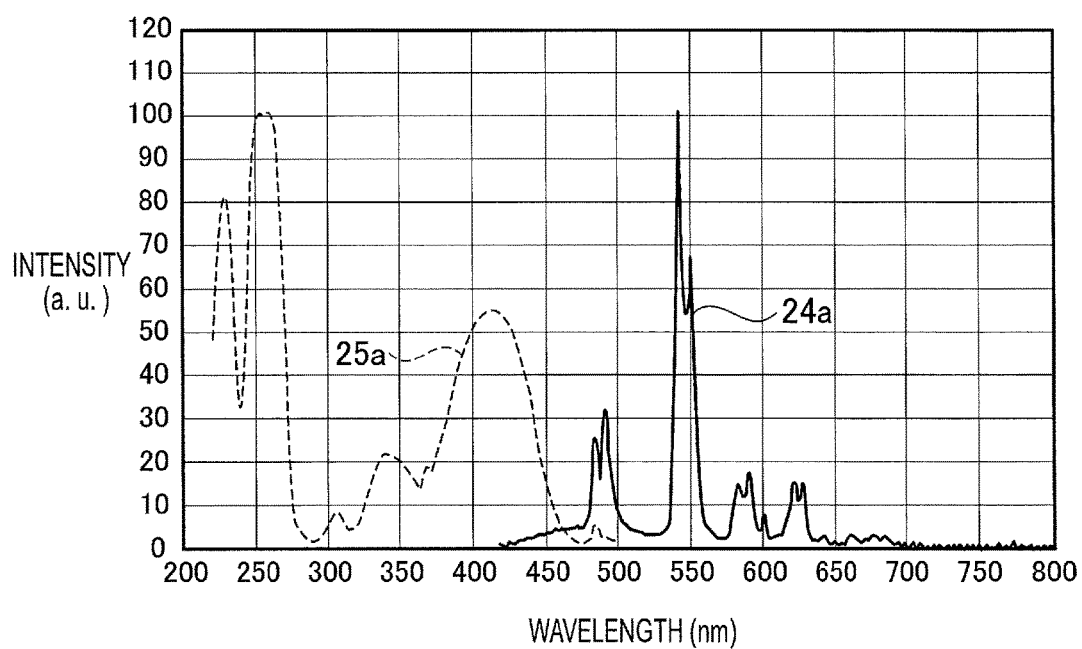
FIG. 10 is a graph showing an excitation spectrum and emission spectrum of a phosphor in Example 3.
Figure 11:
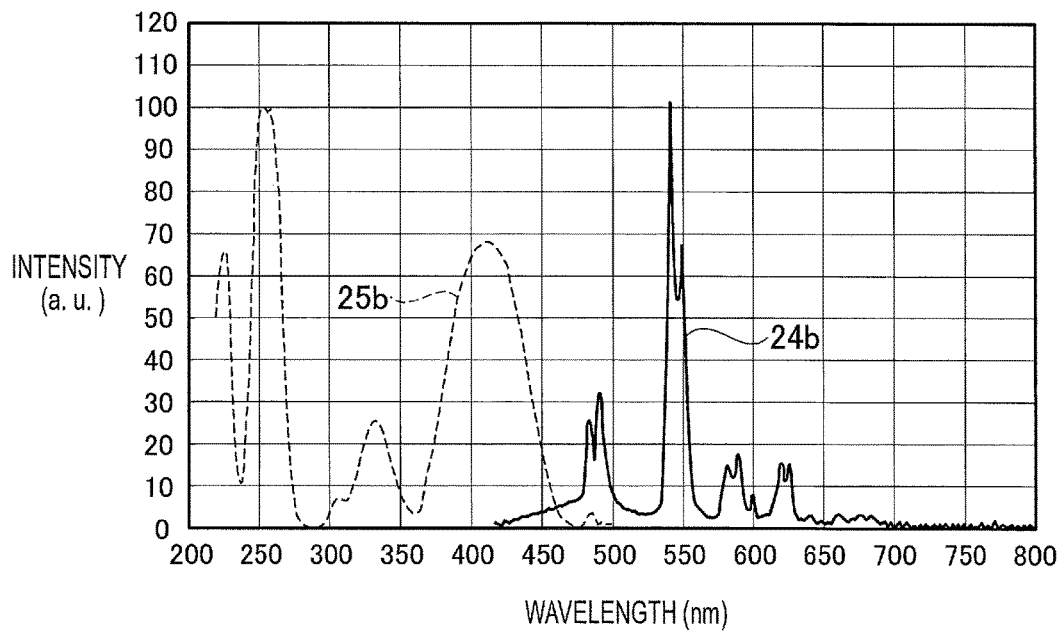
FIG. 11 is a graph showing an excitation spectrum and emission spectrum in Example 4.

Moreover, excitation characteristics and emission characteristics of the compounds of Example 3 and Example 4 were evaluated in a similar way to Example 1. FIG. 10 shows an emission spectrum 24a and excitation spectrum 25a of the compound (Ca$_2$(Tb$_{0.98}$Ce$_{0.02}$)Zr$_2$(AlO$_4$)$_3$) of Example 3. FIG. 11 shows an emission spectrum 24b and excitation spectrum 25b of the compound (Ca$_2$(Tb$_{0.98}$Ce$_{0.02}$)Hf$_2$(AlO$_4$)$_3$) of Example 4. Note that the excitation wavelength at the time of measuring the emission spectrum was set at an excitation peak wavelength, and the monitoring wavelength at the time of measuring the excitation spectrum was set at the emission peak wavelength. Moreover, in FIGS. 10 and 11, the emission spectrum and the excitation spectrum are shown while maximum intensities of both thereof are being taken as 100.

As seen from FIGS. 10 and 11, the excitation spectra of the compounds of Example 3 and Example 4 have longest wavelength-side excitation peaks within the purple wavelength range of 400 nm or more to less than 420 nm. Specifically, the excitation spectrum of the compound of Example 3 has an excitation peak at 417 nm, and the excitation spectrum of the compound of Example 4 has an excitation peak at 412 nm.

Moreover, from FIGS. 10 and 11, it is revealed that the emission spectra of the compounds of Example 3 and Example 4 contain spectrum components derived from the electron energy transition of Tb$^{3+}$. Moreover, each of the emission spectra of the compounds of Example 3 and Example 4 has a shape mainly composed of the emission spectrum derived from the electron energy transition of Tb$^{3+}$. This shape resembles that of the typical lamp-oriented green phosphor such as (La,Ce)PO$_4$:Tb$^{3+}$, CeMgAl$_{11}$O$_{19}$:Tb$^{3+}$ and (Gd,Ce)MgB$_5$O$_{10}$:Tb$^{3+}$, which has heretofore been put into practical use in the three-wavelength fluorescent lamp. That is to say, the phosphor of this embodiment has a significant effect of being capable of emitting the green light with the spectrum shape, which has heretofore been regarded optimum for the illumination light source, by the short-wavelength visible light.

From FIGS. 10 and 11, in each of the emission spectra of the compounds of Example 3 and Example 4, a emission peak wavelength thereof is 544 nm. Moreover, a full width at half maximum of the spectrum component present within the range of 535 nm or more to less than 560 nm is 3 nm or more to less than 30 nm. Furthermore, a 1/5 spectrum width and 1/10 spectrum width of the spectrum component present within this range is also 3 nm or more to less than 30 nm. In addition, a maximum intensity of the spectrum component within the range of 450 nm or more to less than 500 nm is less than 40% of a maximum intensity of the spectrum component within the range of 535 nm or more to less than 560 nm. This matter indicates that each of the compounds of Example 3 and Example 4 absorbs the purple or blue light in the vicinity of 415 nm efficiently, and can perform the wavelength conversion for the purple or blue light into the green light containing the green bright line with high visual sensitivity.

As mentioned above, in Examples 3 and 4, the compounds contain cerium (Ce). Here, it is known that the light absorption by the electron energy transition (4f$^1$→5d$^1$ electron energy transition) of Ce$^{3+}$ is concerned with the spectrum intensity of the short-wavelength visible light range in the excitation spectrum. Then, it is also known that the light absorption is varied depending on a content of Ce$^{3+}$ in the phosphor, and that the intensity of the excitation spectrum is also increased when the content of Ce$^{3+}$ is increased. Therefore, it is assumed that, also in each of the compounds in the examples here, the excitation spectrum intensity within the wavelength range of the short-wavelength visible light is increased by increasing the content of Ce$^{3+}$.

Each of the compounds of Examples 3 and 4 is a compound containing at least, Ca, Tb, Zr or Hf, Al, and oxygen, in which Tb is 0.98 mol in 1 mol of the compound. Moreover, each of the compounds of Examples 3 and 4 is a compound having the garnet structure while taking each of the compounds of Examples 1 and 2 as the end-member. Moreover, the compound of Example 3 can be said to be a solid solution composed of: the compound (Ca$_2$TbZr$_2$(AlO$_4$)$_3$) of Example 1; and a compound (Ca$_2$CeZr$_2$(AlO$_4$)$_3$), which is different therefrom in composition, has a garnet structure, and is isomorphic thereto. The compound of Example 4 can also be said to be a solid solution composed of: the compound (Ca$_2$TbHf$_2$(AlO$_4$)$_3$) of Example 2; and a compound (Ca$_2$CeHf$_2$(AlO$_4$)$_3$), which is different therefrom in composition, has a garnet structure, and is isomorphic thereto. Then, the compounds of Examples 3 and 4, which are as described above, are man-made fluorescent minerals, each of which functions as the phosphor.

Here, when a viewpoint is changed, each of the compounds of Examples 3 and 4 contains Ce, and emits at least the light emission component of Tb$^{3+}$, and moreover, is a phosphor capable of being excited by the short-wavelength visible light. Moreover, from a more bird's viewpoint, each of the compounds of Examples 3 and 4 is a phosphor of a rare earth compound in which rare earth element form a main skeleton of the compound. Then, a part of the elements which compose the above-described rare earth compound is replaced by the fluorescent assistance ions (Ce$^{3+}$ ions). The fluorescence assistance ions intensify the fluorescence composed of the plurality of bright lines, which are based on the energy transition of the trivalent rare earth ions (Tb$^{3+}$ ions) originally contained in the above-described rare earth compound. Then, the number of fluorescence assistance ions is smaller than the number of trivalent rare earth ions originally contained in the rare earth compound. Then, each of the compounds of Examples 3 and 4 is a phosphor excited by the short-wavelength visible light, in which the 1/5 spectrum width of the bright line with the maximum intensity is 3 nm or more to less than 30 nm.

Examples 5 to 11

First, the respective raw materials and the reaction accelerator were weighed in ratios shown in Table 3. Next, these raw materials and reaction accelerator were mixed with one another and baked in a similar way to Examples 1 and 2, whereby compounds of Examples 5 to 11 were prepared. Note that, as a reference example, the compound, which is represented by $Ca_2EuZr_2(AlO_4)_3$ and becomes the red phosphor, was also prepared in a ratio shown in Table 3.

TABLE 3

|  | $CaCO_3$ (g) | $Tb_4O_7$ (g) | $Eu_2O_3$ (g) | $ZrO_2$ (g) | $Al_2O_3$ (g) | $AlF_3$ (g) | $K_2CO_3$ (g) |
| --- | --- | --- | --- | --- | --- | --- | --- |
| Example 5 | 10.009 | 9.253 | 0.089 | 12.322 | 8.019 | 0.063 | 0.035 |
| Example 6 | 10.009 | 9.159 | 0.177 | 12.322 | 8.019 | 0.063 | 0.035 |
| Example 7 | 10.009 | 8.972 | 0.354 | 12.322 | 8.019 | 0.063 | 0.035 |
| Example 8 | 10.009 | 8.598 | 0.709 | 12.322 | 8.019 | 0.063 | 0.035 |
| Example 9 | 10.009 | 7.010 | 2.214 | 12.322 | 8.019 | 0.063 | 0.035 |
| Example 10 | 10.009 | 4.673 | 4.428 | 12.322 | 8.019 | 0.063 | 0.035 |
| Example 11 | 10.009 | 2.337 | 6.643 | 12.322 | 8.019 | 0.063 | 0.035 |
| Reference example | 10.009 | — | 8.857 | 12.322 | 8.019 | 0.063 | 0.035 |

Next, in a similar way to Examples 1 and 2, the crystal structure analysis was performed for the compounds of Examples 5 to 11. As a result, the compounds of Examples 5 to 11 exhibited XRD patterns similar to those of Examples 1 and 2. Therefore, it was revealed that the compound of Example 5 was a compound represented by $Ca_2(Tb_{0.99}Eu_{0.01})Zr_2(AlO_4)_3$. Moreover, it was revealed that the compound of Example 6 was a compound represented by $Ca_2(Tb_{0.98}Eu_{0.02})Zr_2(AlO_4)_3$. It was revealed that the compound of Example 7 was a compound represented by $Ca_2(Tb_{0.96}Eu_{0.04})Zr_2(AlO_4)_3$. It was revealed that the compound of Example 8 was a compound represented by $Ca_2(Tb_{0.92}Eu_{0.08})Zr_2(AlO_4)_3$. It was revealed that the compound of Example 9 was a compound represented by $Ca_2(Tb_{0.75}Eu_{0.25})Zr_2(AlO_4)_3$. It was revealed that the compound of Example 10 was a compound represented by $Ca_2(Tb_{0.5}Eu_{0.5})Zr_2(AlO_4)_3$. It was revealed that the compound of Example 11 was a compound represented by $Ca_2(Tb_{0.25}Eu_{0.75})Zr_2(AlO_4)_3$.

Moreover, excitation characteristics and emission characteristics of the compounds in Examples 5 to 11 were evaluated in a similar way to Example 1. FIGS. 12(a), 12(b), 12(c), 12(d), 12(e), 12(f), 12(g), 12(h) and 12(i) show the emission spectra and excitation spectra of the compounds in Reference example, Example 11, Example 10, Example 9, Example 8, Example 7, Example 6, Example 5 and Example 1. Note that, in FIG. 12, the emission spectra are denoted by reference numerals 24c to 24j and 24a', and the excitation spectra are denoted by reference numerals 25c to 25j and 25a'.

Moreover, the excitation wavelength at the time of measuring the emission spectrum was set at 254 nm, and the monitoring wavelength at the time of measuring the excitation spectrum was set at the emission peak wavelength (610 nm). Furthermore, in FIG. 12, each of the emission spectra and each of the excitation spectra are shown while maximum intensities of both thereof are being taken as 100.

Figure 12:
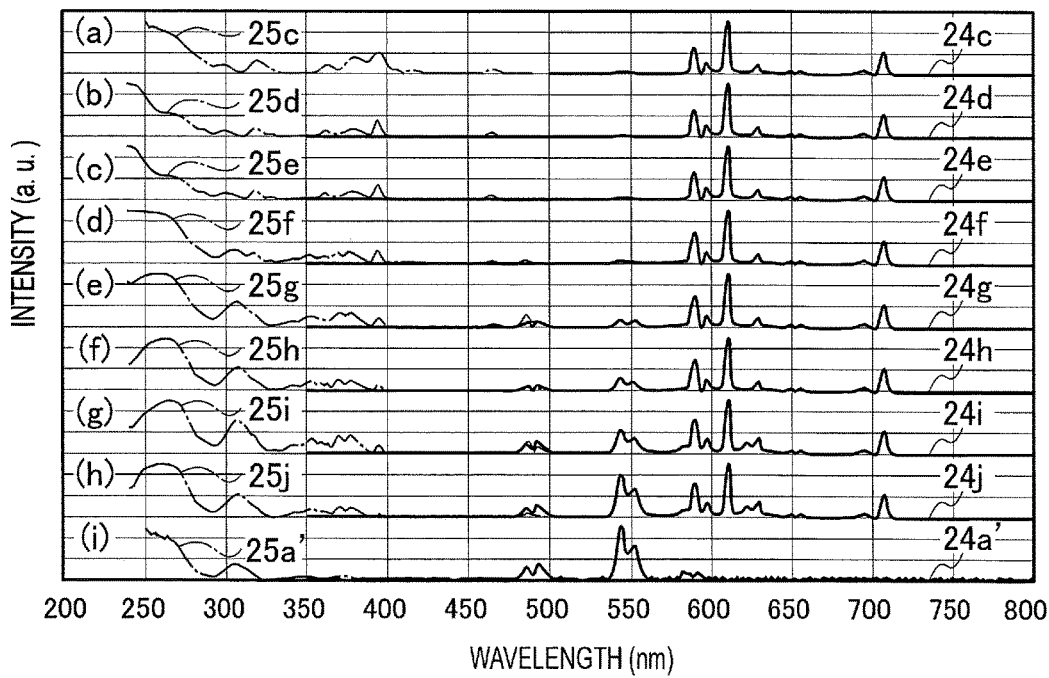
FIG. 12 is a graph showing excitation spectra and emission spectra in Examples 5 to 11.

From FIG. 12, in the emission spectra of Examples 5 to 11, as a substitution amount of Eu for Tb is being increased from Example 5 (24j) to Example 11 (24d), the fluorescent component in the vicinity of 550 nm is suddenly decreased, and the fluorescent component within the wavelength range of 580 to 620 nm becomes dominant. Note that the fluorescent component in the vicinity of 550 nm indicates the green bright line, and the fluorescent component within the wavelength range of 580 to 620 nm indicates the red bright line.

Moreover, as seen from FIG. 12, in the emission spectra (24j and 24i) of Examples 5 and 6, in each of which the substitution amount of Eu is 1 to 2 atom %, the green bright lines and the red bright lines are obviously present in a mixed manner. However, in the emission spectra (24h and 24g) of Examples 7 and 8, in each of which the substitution amount of Eu is 4 to 8 atom %, the green bright lines are hardly observed. Moreover, in the emission spectra (24g to 24d) of Examples 9 to 11, in each of which the substitution amount of Eu exceeds 8 atom % or more, the green bright lines disappear substantially. That is to say, a part of terbium is replaced by europium in which the number of atoms does not reach 10 atom % of the number of terbium atoms, whereby the fluorescent component by terbium came not to be observed.

Note that the green bright lines in FIG. 12 can be regarded as the spectrum components derived from the electron energy transition of $Tb^{3+}$. Moreover, the red bright lines in FIG. 12 can be regarded as the spectrum components derived from the electron energy transition of $Eu^{3+}$.

Meanwhile, when attention is paid to the excitation spectrum (25d to 25j) of Examples 5 to 11, the excitation spectra (25f, 25e, 25d) of Examples 9, 10 and 11 resemble the excitation spectrum (25c) of $Ca_2EuZr_2(AlO_4)_3$ taken as Reference example. In contrast, the excitation spectra (25j, 25i, 25h, 25g) of Examples 5, 6, 7 and 8 resemble the excitation spectrum ($25a^{3+}$) of Example 1, and each thereof has the peaks in the vicinity of 260 nm, the vicinity of 310 nm and the vicinity of 375 nm.

As described above, though the phosphors of Examples 5 to 8 contained a large amount of terbium, the light emission derived from a small amount of $Eu^{3+}$ was dominant. Then, though the light emission derived from $Eu^{3+}$ was dominant, the shapes (25g to 25j) of the excitation spectra thereof were similar to the excitation spectrum (25a') of Example 1 rather than to the excitation spectrum (25c) of Reference example. Then, shape changes of the excitation spectrum and the emission spectrum, which are shown in FIG. 12, prove that the energy transfer from Tb to Eu efficiently occurs particularly in the composition range where the terbium content is large and the europium content is small.

Note that the energy transfer from Tb to Eu occurs efficiently in the composition, in which the number of Tb moles in 1 mol of the phosphor exceeds 0.5, and the number of Eu moles therein becomes less than 0.25. Therefore, preferably, the composition as described above is used as the phosphor of this embodiment.

Meanwhile, the emission spectra of FIG. 12 also show that the phosphor of this embodiment has a significant effect of being capable of emitting fluorescence at least containing either one of the green spectrum component and the red spectrum component, which have heretofore been regarded optimum for the illumination light source.

Example 12

First, the respective raw materials and the reaction accelerator were weighed in a ratio shown in Table 4. Next, these raw materials and reaction accelerator were mixed with one another and baked in a similar way to Example 1 and Example 2, whereby a compound of Example 12 was prepared.

TABLE 4

|  | $CaCO_3$ (g) | $Tb_4O_7$ (g) | $CeO_2$ (g) | $Eu_2O_3$ (g) | $ZrO_2$ (g) | $Al_2O_3$ (g) | $AlF_3$ (g) | $K_2CO_3$ (g) |
|---|---|---|---|---|---|---|---|---|
| Example 12 | 10.009 | 8.692 | 0.516 | 0.089 | 12.322 | 8.019 | 0.063 | 0.035 |

Next, in a similar way to Examples 1 and 2, the crystal structure analysis was performed for the compound of Example 12. As a result, the compound of Example 12 exhibited the XRD pattern similar to those of Examples 1 and 2. Therefore, it was revealed that the compound of Example 12 was a compound represented by $Ca_2(Tb_{0.93}Ce_{0.06}Eu_{0.01})Zr_2(AlO_4)_3$.

Figure 13:
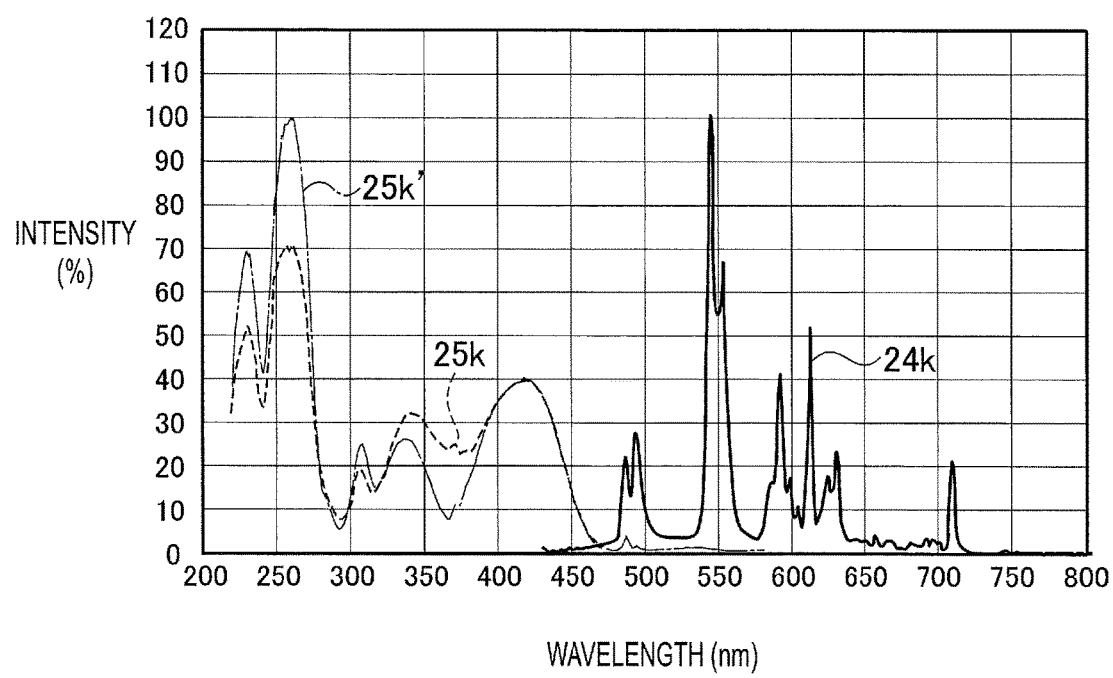
FIG. 13 is a graph showing excitation spectra and emission spectrum of a phosphor in Example 12.

Moreover, excitation characteristics and emission characteristics of the compound of Example 12 were evaluated in a similar way to Example 1. FIG. 13 shows an emission spectrum 24k and excitation spectra 25k and 25k' of the compound of Example 12. Note that the excitation wavelength at the time of measuring the emission spectrum was set at 254 nm. Moreover, the monitoring wavelength at the time of measuring the excitation spectrum was set to be two, which are: a emission peak wavelength (543 nm) of the green spectrum component derived from the electron energy transition of $Tb^{3+}$; and a emission peak wavelength (610 nm) of the red spectrum component derived from the electron energy transition of $Eu^{3+}$. Then, in FIG. 13, the excitation spectrum in which the monitoring wavelength was 543 nm was denoted by reference numeral 25k, and the excitation spectrum in which the monitoring wavelength was 610 nm was denoted by reference numeral 25k'.

Moreover, in FIG. 13, the emission spectrum 24k is shown while maximum intensity thereof is being taken as 100. The excitation spectrum 25k' in which the monitoring wavelength is 610 nm is shown while maximum intensity thereof is being taken as 100. Furthermore, the excitation spectrum 25k in which the monitoring wavelength is 543 nm is shown so that the intensity of the excitation peak of the excitation spectrum 25k' in the vicinity of 420 nm can be equal thereto.

As seen from FIG. 13, the excitation spectrum of the compound of Example 12 has the longest wavelength-side excitation peak within the purple blue wavelength range from 400 nm or more to less than 430 nm. Specifically, the excitation spectrum 25k in which the monitoring wavelength is 543 nm has the longest wavelength-side excitation peak at 419 nm. Moreover, the excitation spectrum 25k' in which the monitoring wavelength is 610 nm has the longest wavelength-side excitation peak at 421 nm. When measurement errors are taken into consideration, the excitation peaks on the longest wavelength side become 420 nm.

Note that the longest wavelength-side excitation peak in Example 12 is an excitation band derived from the electron energy transition of $Ce^{3+}$, and is an excitation band by the light absorption of $Ce^{3+}$. With regard to the excitation band derived from the electron energy transition of $Ce^{3+}$, the excitation peak wavelength thereof can be moved within a range of several nanometers to several ten nanometers by changing the composition of the compound a little.

Moreover, from FIG. 13, it is revealed that the emission spectrum of Example 12 contains the spectrum component, which is derived from the electron energy transition of $Tb^{3+}$, and the spectrum component, which is derived from the electron energy transition of $Eu^{3+}$.

Moreover, the emission spectrum of Example 12 has a shape that combines the emission spectrum, which is derived from the electron energy transition of $Tb^{3+}$, and the spectrum component, which is derived from the electron energy transition of $Eu^{3+}$, with each other. This shape is a shape in which the spectrum shape of the green phosphor, which has heretofore been put into practical use in the three-wavelength fluorescent lamp, and the spectrum shape of the red phosphor are superimposed on each other. Then, by additive color mixture of the green light component and the red light component, an apparent fluorescent color becomes yellow. Moreover, intensity of a light emission component, for example, at the wavelength of 575 nm within the wavelength range of yellow, the light emission component causing an irradiated object to look yellow, is less than 10%. Therefore, yellow light, which does not make such yellow looking of the irradiated object conspicuous, is obtained.

That is to say, the phosphor of this embodiment has a significant effect of being capable of obtaining the mixed color light of green light and red light, each of which has the spectrum shape that has heretofore been regarded optimum for the illumination light source, by the excitation of the short-wavelength visible light without mixing the plurality of phosphors with one another.

Moreover, from FIG. 13, with regard to the emission spectrum of the compound of Example 12, the emission peak wavelength thereof is 543 nm. Furthermore, a full width at half maximum of the spectrum component present within the range of 535 nm or more to less than 560 nm is 3 nm or more to less than 30 nm. Furthermore, a ⅕ spectrum width and 1/10 spectrum width of the spectrum component present within this range is also 3 nm or more to less than 30 nm. In addition, a maximum intensity of the spectrum component within the range of 450 nm or more to less than 500 nm is less than 40% of a maximum intensity of the spectrum component within the range of 535 nm or more to less than 560 nm.

Then, the main bright line of the spectrum component derived from the electron energy transition of $Eu^{3+}$ (hereinafter, this main bright line is also referred to as a Eu main bright line) is present within the wavelength range of 600 nm or more to less than 628 nm. Moreover, the maximum height of the bright line, which is derived from the electron energy transition of $Eu^{3+}$ and is present within the wavelength range of 700 nm or more to less than 720 nm, is less than 60%, and particularly, 40% or less of the maximum height of the above-described Eu main bright line. This matter indicates that the compound of Example 12 can absorb the purple or blue light in the vicinity of 420 nm efficiently, and can perform the wavelength conversion for the absorbed purple or blue light into the mixed color light of the green color component and the red color component, which contains the green bright line with high visual sensitivity and the red bright line with a good color tone.

Note that, in Example 12, the description has been made of the example, where, when the total number of rare earth atoms (that is, the sum of the number of Tb atoms, the number of Ce atoms and the number of Eu atoms) is taken as 100, the number of Ce atoms and the number of Eu atoms are set at 6 and 1, respectively. Then, in this composition, as shown in FIG. 13, yellow light has been obtained, in which the green spectrum component derived from the electron energy transition of $Tb^{3+}$ is dominant over the red spectrum component derived from the electron energy transition of $Eu^{3+}$.

However, in the phosphor of this embodiment, the energy transfer from $Tb^{3+}$ to $Eu^{3+}$ occurs efficiently. Therefore, by increasing the number of Eu atoms, a phosphor can also be obtained, which emits light (yellow light, orange light, or red light) in which the red spectrum component derived from the electron energy transition of $Eu^{3+}$ is dominant over the green spectrum component derived from the electron energy transition of $Tb^{3+}$. Moreover, it is also possible to substantially obtain a phosphor that emits red light having only the red spectrum component derived from the electron energy transition of $Eu^{3+}$.

Moreover, as mentioned above, in Example 12, cerium (Ce) is contained in the compound. Here, it is known that the light absorption by the electron energy transition ($4f^1 \rightarrow 5d^1$ electron energy transition) of $Ce^{3+}$ is concerned with the spectrum intensity of the short-wavelength visible light range in the excitation spectrum. Then, it is also known that the light absorption is varied depending on a content of $Ce^{3+}$ in the phosphor, and that the intensity of the excitation spectrum is also increased when the content of $Ce^{3+}$ is increased. Therefore, it is assumed that, also in the compound in this example here, the excitation spectrum intensity within the wavelength range of the short-wavelength visible light is increased by increasing the content of $Ce^{3+}$.

Note that the compound of Example 12 is a solid solution with a garnet structure, which is composed of at least two types of compounds taken as end-members. That is to say, the first compound that becomes the end-member is the terbium compound represented by $Ca_2TbZr_2(AlO_4)_3$. Moreover, the second compound that becomes the end-member is the europium compound represented by $Ca_2EuZr_2(AlO_4)_3$. Then, the solid solution contains Ce. Therefore, the solid solution obtains the excitation band derived from the electron energy transition of $Ce^{3+}$, and comes to emit the fluorescence.

The entire contents of Japanese Patent Application No. 2012-278132 (filed on: Dec. 20, 2012) and Japanese Patent Application No. 2013-094497 (filed on: Apr. 26, 2013) are incorporated herein by reference.

The description has been made above of the present invention by the embodiments, the examples and the comparative examples; however, the present invention is not limited to these, and is modifiable in various ways within the scope of the spirit of the present invention. Moreover, the above-mentioned embodiments are merely examples, and those skilled in the art can easily imagine that that there exist numerous phosphors as modification examples, which are formed based on the above-mentioned mechanism. It can be estimated that, following the progress of the technology in the future, such numerous modification examples are discovered.

INDUSTRIAL APPLICABILITY

The inorganic oxide of the present invention has the garnet structure, and accordingly, can be used for the man-made jewelry and abrasive, the ceramic material, the electronic material and the like. Moreover, the phosphor of the present invention is capable of being excited by the short-wavelength visible light, and further, can radiate the narrow-band light component. Furthermore, the light-emitting device using this phosphor is useful as an illumination light source, a light-emitting light source, and an electronic instrument.

REFERENCE SIGNS LIST

2 PHOSPHOR
6 SOLID-STATE LIGHT-EMITTING ELEMENT

The invention claimed is:
1. An inorganic oxide comprising:
a composition represented by General formula:

$$M_2LnX_2(AlO_4)_3 \qquad (1)$$

where M includes Ca, Ln includes Tb, and X includes at least either one of Zr and Hf,
wherein a number of Tb moles in General formula (1) is 0.1 or more to 1 or less, and a crystal structure of the inorganic oxide is a garnet structure.

2. The inorganic oxide according to claim 1, wherein M includes: Ca; and at least one element selected from the group consisting of alkaline earth metal, Fe, Mn, Zn, Cd, Co and Cu,
Ln includes: Tb; and at least one element selected from the group consisting of Sc, Y, La, Ce, Pr, Nd, Sm, Eu, Gd, Dy, Ho, Er, Tm, Yb, Lu, In, Sb and Bi, and
X includes: at least either one of Zr and Hf; and at least one element selected from the group consisting of Si, Ge, Ti, Sn and Pb.

3. The inorganic oxide according to claim 1, wherein M is Ca, Ln is Tb, and X is either one of Zr and Hf.

4. A solid solution comprising: the inorganic oxide according to claim 1; and an inorganic compound that is solid-solved with the inorganic oxide and is different from the inorganic oxide in composition,
wherein a number of Tb moles in 1 mol of the solid solution is 0.1 mol or more to less than 3 mol, and
a crystal structure of the solid solution is a garnet structure.

5. The solid solution according to claim 4, wherein the solid solution has a composition represented by General formula (4): $A_3D_2(EG_4)_3$
where A includes: Ca and Tb; and at least one element selected from alkali metal, alkaline earth metal and a rare earth element,
D includes: the element represented by X; and at least one element selected from Mg, Sc, Y, Ti, V, Zr, Hf, Zn, Al, Ga, In, Ge and Sn,
E includes: Al; and at least one element selected from Zn, Al, Si, Ge and P, and
G includes O.

6. A phosphor comprising:
the inorganic oxide according to claim 1.

7. The phosphor according to claim 6, further comprising:
$Ce^{3+}$ as an activator,
wherein an excitation spectrum of the phosphor has an excitation band provided by $Ce^{3+}$.

8. The phosphor according to claim 6, wherein a wavelength of an emission spectrum has a maximum value within a range of 535 nm or more to less than 560 nm, and a ⅕ spectrum width of the emission spectrum within the range of 535 nm or more to less than 560 nm is 3 nm or more to less than 30 nm.

9. The phosphor according to claim 6, further comprising:
$Ce^{3+}$ and $Eu^{3+}$ as activators, wherein $Eu^{3+}$ contained in the inorganic oxide emits a fluorescent component, and
wherein a wavelength of an emission spectrum has a maximum value within a range of 600 nm or more to less than 628 nm.

10. The phosphor according to claim 6, wherein the phosphor contains Tb, Ce and Eu, and is composed of a single-phase compound, an excitation spectrum of the phosphor has a broad excitation band provided by absorption of $Ce^{3+}$, and the excitation band has an excitation peak within a range of 400 nm or more to less than 460 nm, and an emission spectrum of the phosphor has a fluorescent component provided by at least either one of $Tb^{3+}$ and $Eu^{3+}$, and intensity of the emission spectrum at a wavelength of 575 nm is smaller than 10% of a maximum value of the emission spectrum.

11. The phosphor according to claim 10, wherein intensity of the emission spectrum at a wavelength of 520 nm is smaller than 30% of the maximum value of the emission spectrum.

12. The phosphor according to claim 6, further comprising:
at least $Ce^{3+}$ and $Tb^{3+}$ as emission centers, wherein an excitation spectrum of the phosphor has a broad excitation band provided by absorption of $Ce^{3+}$, and the excitation band has a peak within a range of 400 nm or more to less than 460 nm,
an emission spectrum of the phosphor emits a green fluorescent component provided by $Tb^{3+}$, and
emission intensity of the emission spectrum at a wavelength of 520 nm is smaller than 30% of a maximum value of the emission spectrum.

13. The phosphor according to claim 6, further comprising:
at least $Ce^{3+}$, $Tb^{3+}$ and $Eu^{3+}$ as emission centers, wherein an excitation spectrum of the phosphor has a broad excitation band provided by absorption of $Ce^{3+}$, and the excitation band has a peak within a range of 400 nm or more to less than 460 nm,
an emission spectrum of the phosphor emits a green fluorescent component provided by $Tb^{3+}$ and/or a red fluorescent component provided by $Eu^{3+}$, and
emission intensity of the emission spectrum at a wavelength of 520 nm is smaller than 30% of a maximum value of the emission spectrum.

14. The phosphor according to claim 13, wherein, in the emission spectrum, the green fluorescent component provided by $Tb^{3+}$ or the red fluorescent component provided by $Eu^{3+}$ becomes the maximum value of the emission spectrum.

15. A light-emitting device comprising:
the phosphor according to claim 6.

16. The light-emitting device according to claim 15, wherein the phosphor is excited by short-wavelength visible light having a peak within a range of 380 nm or more to less than 470 nm.

* * * * *